(12) United States Patent
Seo et al.

(10) Patent No.: US 9,825,142 B2
(45) Date of Patent: Nov. 21, 2017

(54) METHODS OF FABRICATING SEMICONDUCTOR DEVICES

(71) Applicant: Samsung Electronics Co., Ltd., Suwon-si (KR)

(72) Inventors: HyeoungWon Seo, Yongin-si (KR); Daehyun Moon, Suwon-si (KR); Jooyoung Lee, Hwaseong-si (KR); Ilgweon Kim, Hwaseong-si (KR); Dongjin Jung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/976,536

(22) Filed: Dec. 21, 2015

(65) Prior Publication Data

US 2016/0181258 A1    Jun. 23, 2016

(30) Foreign Application Priority Data

Dec. 22, 2014    (KR) ........................ 10-2014-0186308

(51) Int. Cl.
*H01L 29/36*    (2006.01)
*H01L 29/423*   (2006.01)
*H01L 29/66*    (2006.01)
*H01L 21/265*   (2006.01)
*H01L 29/06*    (2006.01)
(Continued)

(52) U.S. Cl.
CPC .... *H01L 29/4236* (2013.01); *H01L 21/26513* (2013.01); *H01L 21/762* (2013.01); *H01L 27/10823* (2013.01); *H01L 27/10876* (2013.01); *H01L 27/10894* (2013.01);
(Continued)

(58) Field of Classification Search
CPC ................................................. H01L 21/26513
See application file for complete search history.

(56) References Cited

U.S. PATENT DOCUMENTS 6,066,881 A * 5/2000 Shimizu ............ H01L 27/10894
257/296
6,144,079 A * 11/2000 Shirahata .......... H01L 21/26513
257/296
(Continued)

FOREIGN PATENT DOCUMENTS

JP    2003-158201    5/2003
JP    2010-087133    4/2010
(Continued)

*Primary Examiner* — Caridad Everhart
*Assistant Examiner* — Ankush Singal
(74) *Attorney, Agent, or Firm* — Ward and Smith, P.A.

(57) ABSTRACT

Methods of fabricating semiconductor devices include forming a first impurity region in a substrate by implanting a first impurity of a first conductivity type in a cell region and a peripheral region of the substrate to a first target depth from a top surface of the substrate; forming a second impurity region in the cell region and the peripheral region by implanting a second impurity of the first conductivity type into the cell region and the peripheral region to a second target depth that is smaller than the first depth from the top surface of the substrate; forming a cell transistor with a channel in the cell region, wherein the first impurity region forms the channel of the cell transistor; and forming a peripheral transistor with a channel in the peripheral region, wherein the second impurity region forms the channel of the peripheral transistor.

20 Claims, 30 Drawing Sheets

(51) Int. Cl.
   *H01L 21/762* (2006.01)
   *H01L 27/108* (2006.01)

(52) U.S. Cl.
   CPC .... *H01L 29/0696* (2013.01); *H01L 29/66575* (2013.01); *H01L 29/66734* (2013.01); *H01L 27/10814* (2013.01)

(56) References Cited

U.S. PATENT DOCUMENTS

| | | | |
|---|---|---|---|
| 6,420,771 | B2 | 7/2002 | Gregory |
| 6,727,573 | B2 | 4/2004 | Mitani et al. |
| 6,730,952 | B2 | 5/2004 | Byun |
| 7,611,947 | B2 | 11/2009 | Manabe |
| 7,772,654 | B2 | 8/2010 | Shin et al. |
| 7,935,595 | B2 * | 5/2011 | Shiratake .......... H01L 27/10897 438/257 |
| 8,022,475 | B2 | 9/2011 | Takeda et al. |
| 8,211,786 | B2 * | 7/2012 | Cheng ............. H01L 21/823807 257/255 |
| 8,298,893 | B2 * | 10/2012 | Kim ................. H01L 27/10894 257/E21.419 |
| 8,574,974 | B2 | 11/2013 | Minami |
| 2003/0095445 | A1 * | 5/2003 | Shinkawata .... H01L 21/823892 365/200 |
| 2004/0232494 | A1 * | 11/2004 | Nagano ............. H01L 21/82385 257/382 |
| 2006/0228851 | A1 * | 10/2006 | Sadaka ............... H01L 29/1054 438/221 |
| 2008/0111155 | A1 * | 5/2008 | Capasso .......... H01L 21/823807 257/192 |
| 2008/0284029 | A1 * | 11/2008 | Kim ................. H01L 21/76829 257/758 |
| 2009/0014789 | A1 | 1/2009 | Manabe |
| 2009/0072289 | A1 * | 3/2009 | Kim ................. H01L 21/82345 257/298 |
| 2009/0114991 | A1 * | 5/2009 | Kim ................. H01L 21/82345 257/365 |
| 2010/0084720 | A1 * | 4/2010 | Oh ................... H01L 21/28035 257/412 |
| 2010/0244110 | A1 * | 9/2010 | Kim ................. H01L 27/10817 257/296 |
| 2011/0198700 | A1 * | 8/2011 | Park ...................... H01L 27/105 257/369 |
| 2012/0007160 | A1 * | 1/2012 | Kim ................. H01L 21/82345 257/306 |
| 2012/0214297 | A1 * | 8/2012 | Cho .................... H01L 29/4236 438/586 |
| 2012/0281490 | A1 * | 11/2012 | Cho ................. H01L 27/10876 365/205 |
| 2012/0299090 | A1 * | 11/2012 | Kim ................. H01L 27/10873 257/331 |
| 2014/0159148 | A1 * | 6/2014 | Chung ............. H01L 27/10814 257/330 |
| 2015/0055401 | A1 * | 2/2015 | Kim ................. H01L 27/10873 365/149 |
| 2015/0108574 | A1 * | 4/2015 | Sung ................. H01L 21/02038 257/347 |
| 2015/0132945 | A1 * | 5/2015 | Park ................. H01L 27/10894 438/637 |
| 2015/0270345 | A1 | 9/2015 | Hwang et al. |
| 2015/0340453 | A1 * | 11/2015 | Cho .................... H01L 29/423 257/330 |
| 2016/0064556 | A1 * | 3/2016 | Qin ................. H01L 21/26513 257/334 |

FOREIGN PATENT DOCUMENTS

| | | |
|---|---|---|
| KR | 101328667 | 11/2013 |
| KR | 1020150110946 | 10/2015 |

* cited by examiner

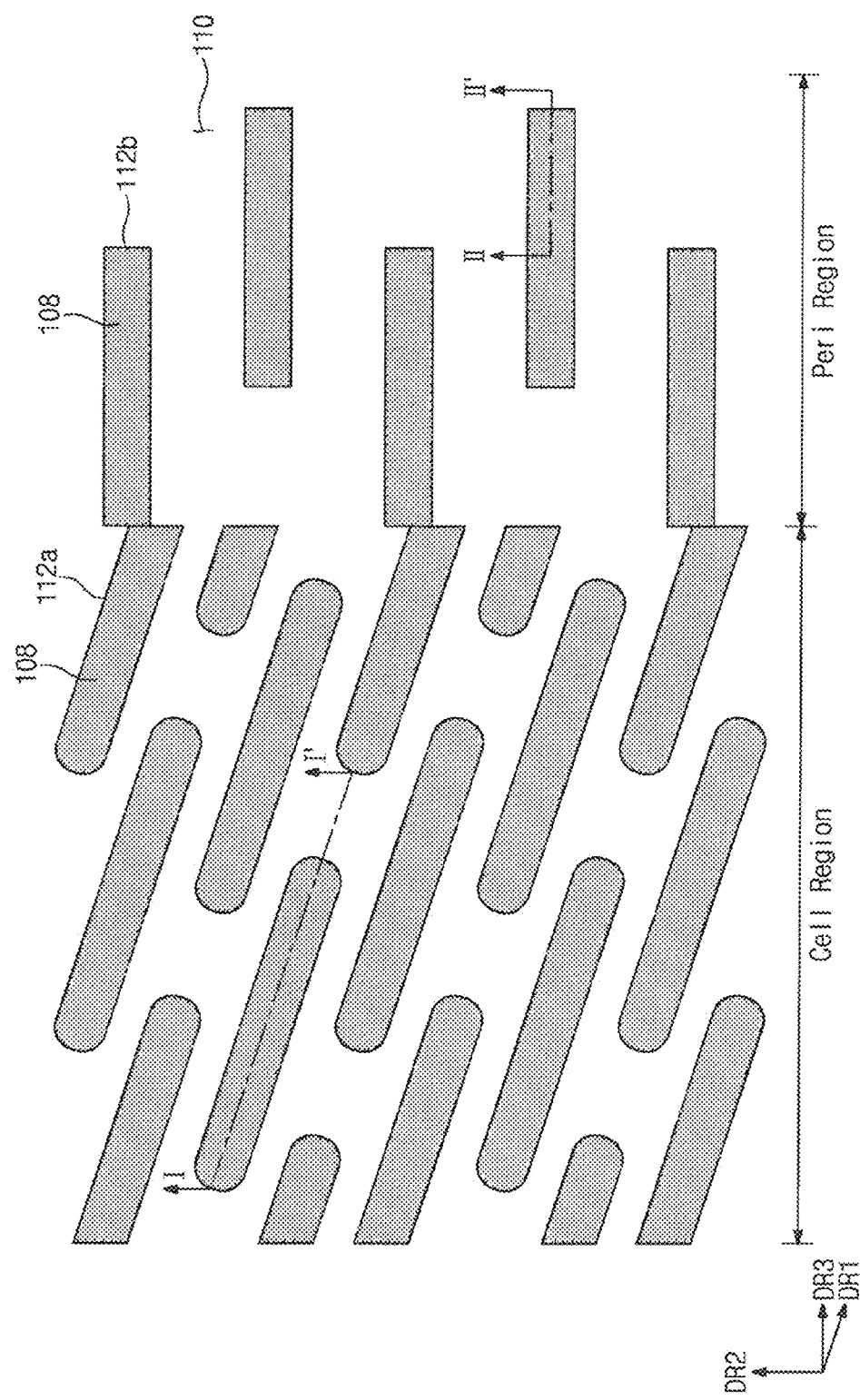

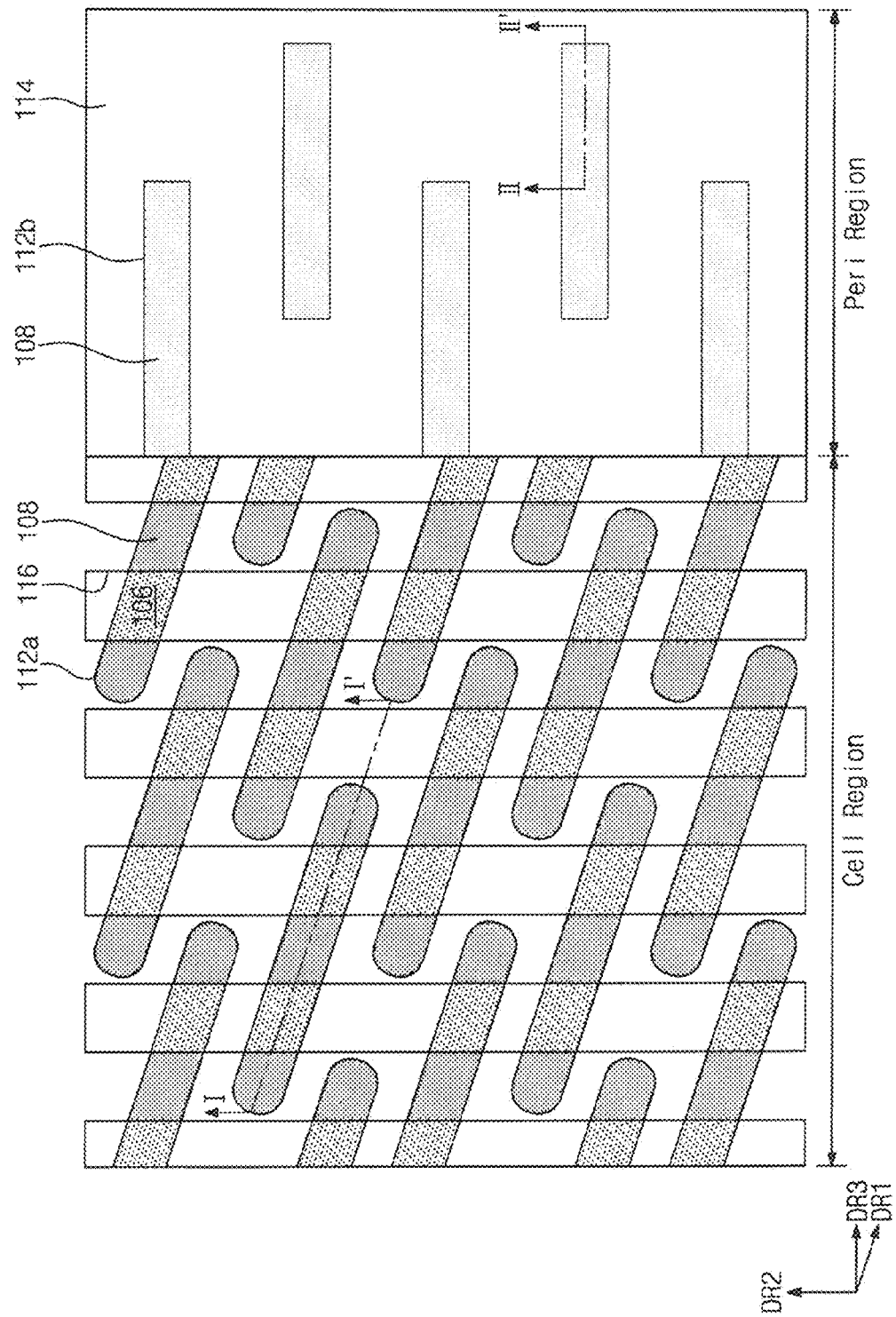

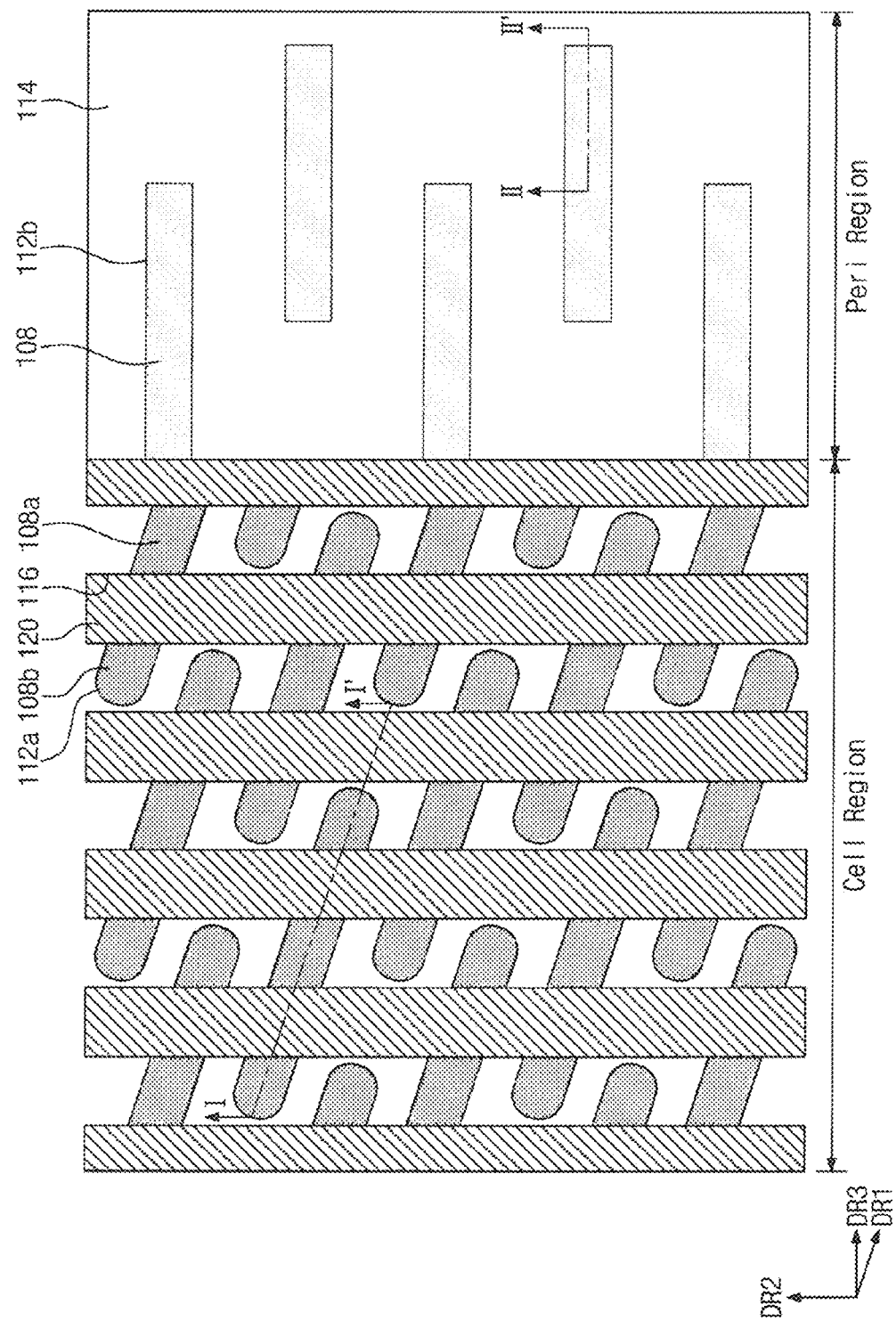

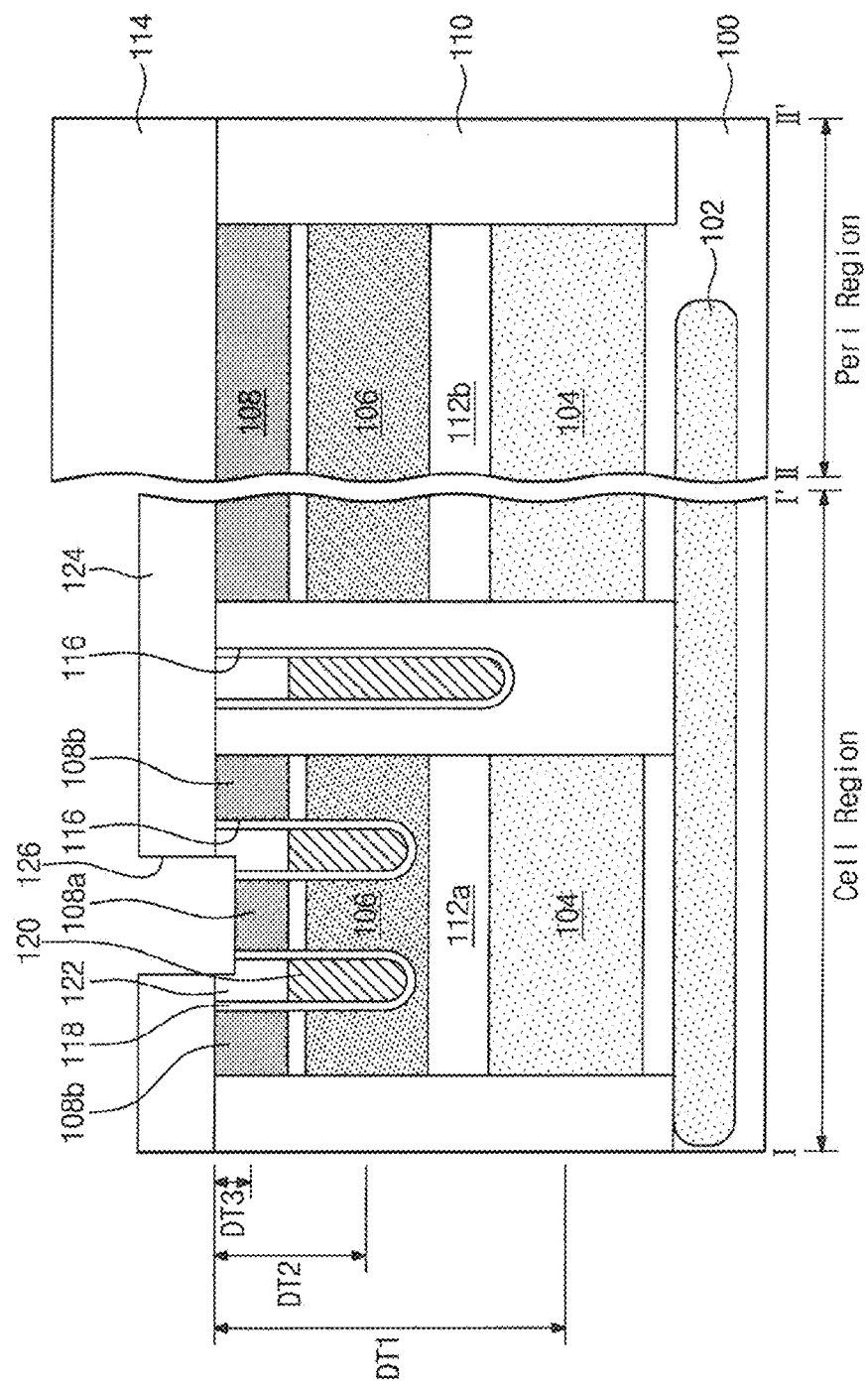

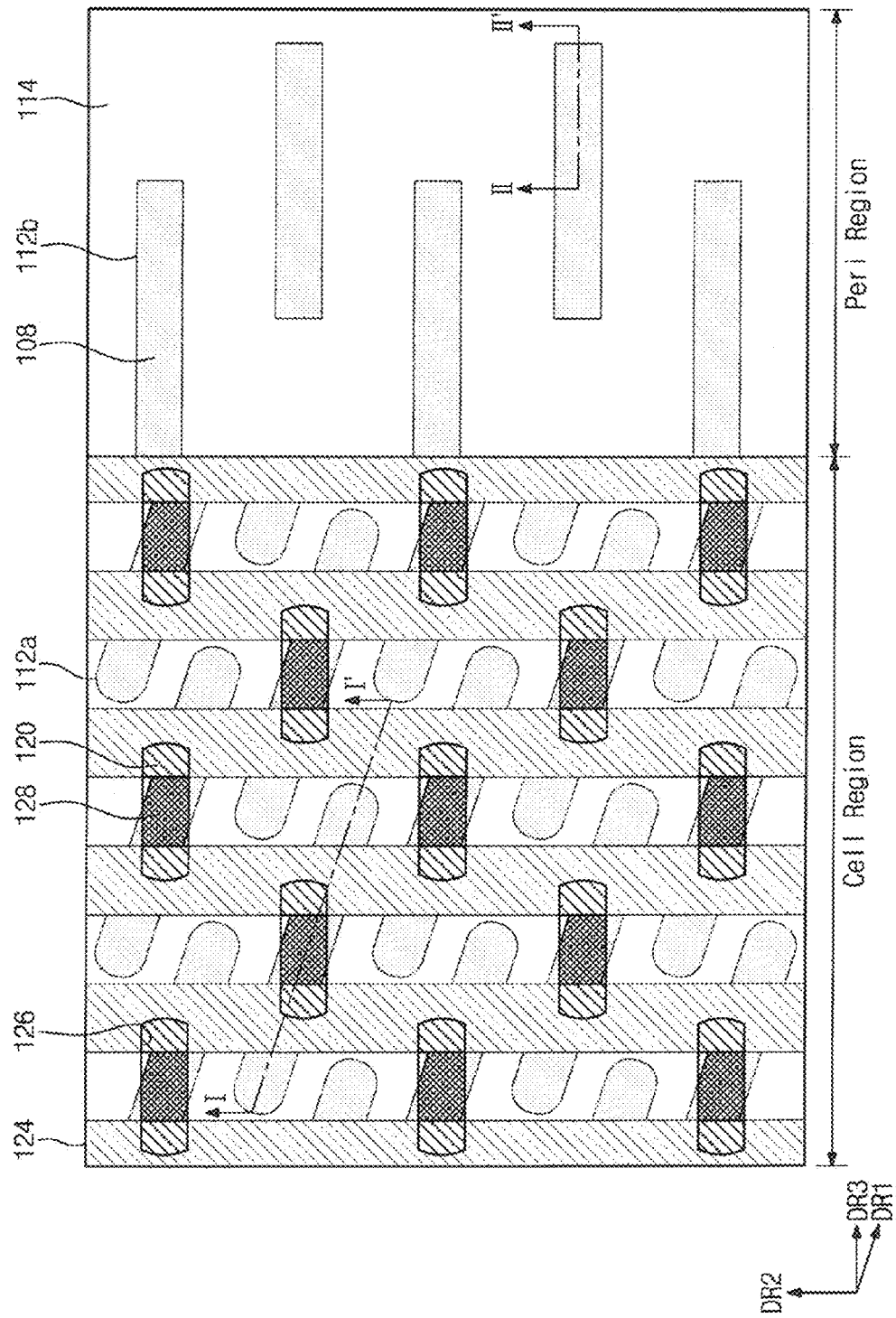

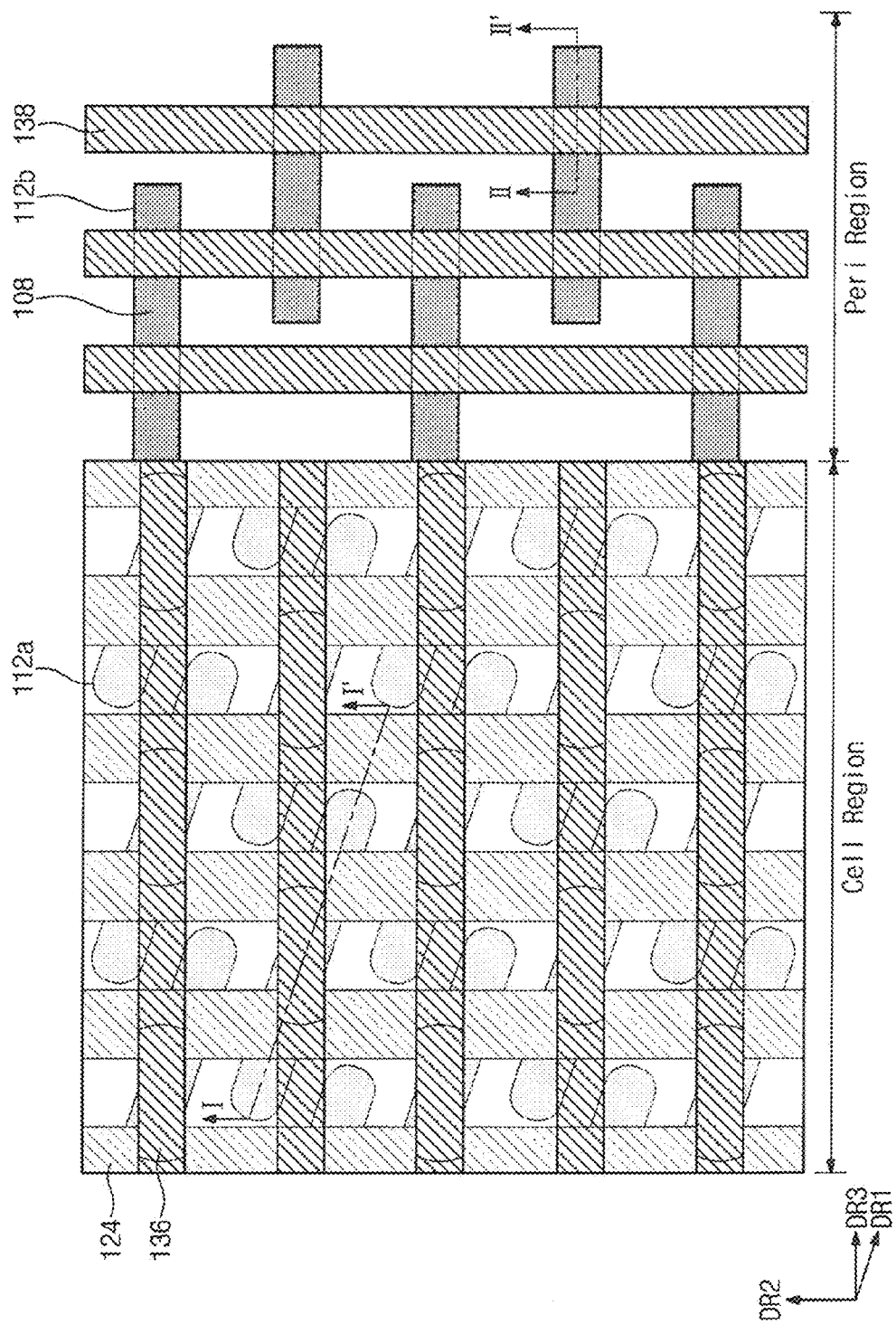

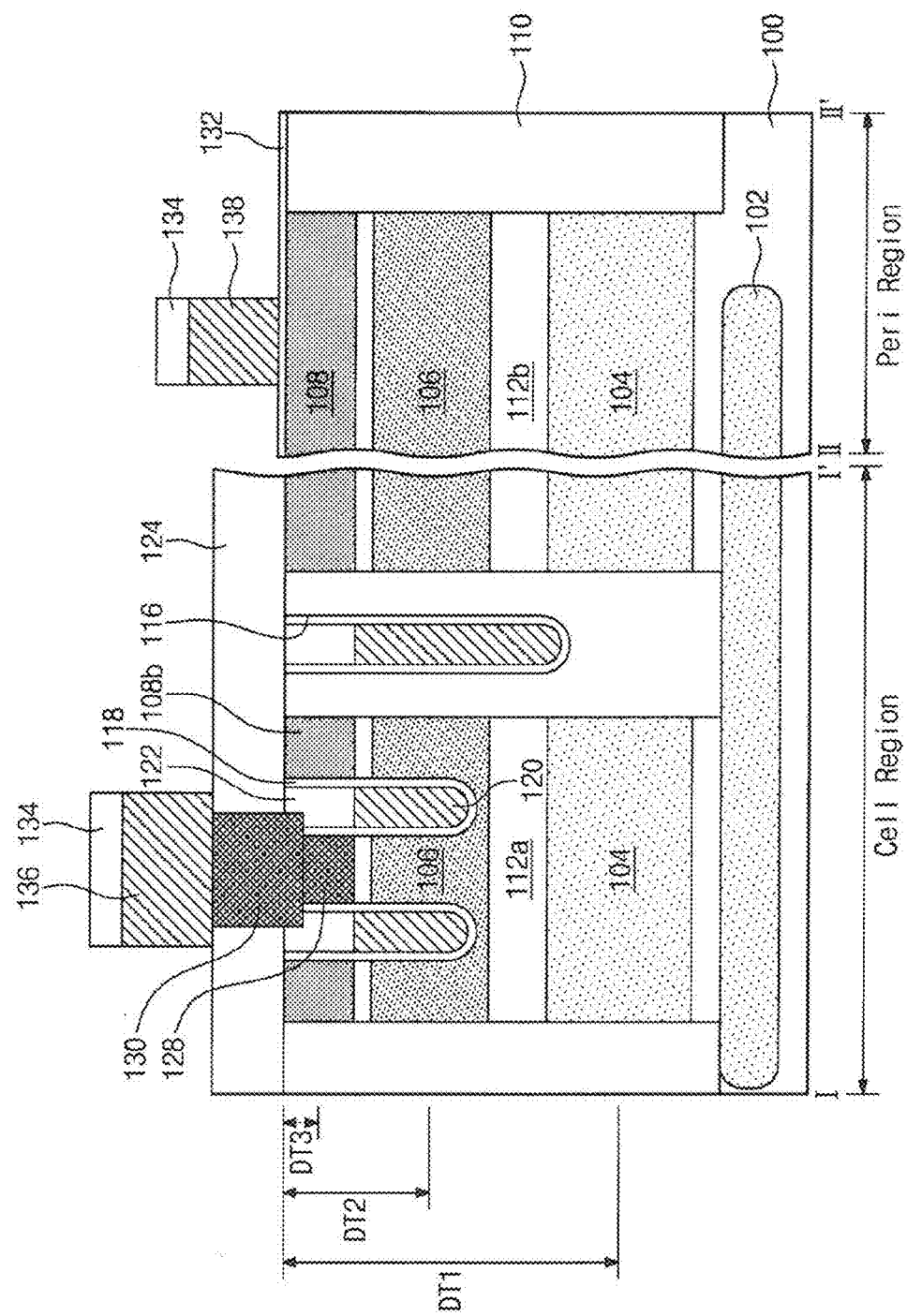

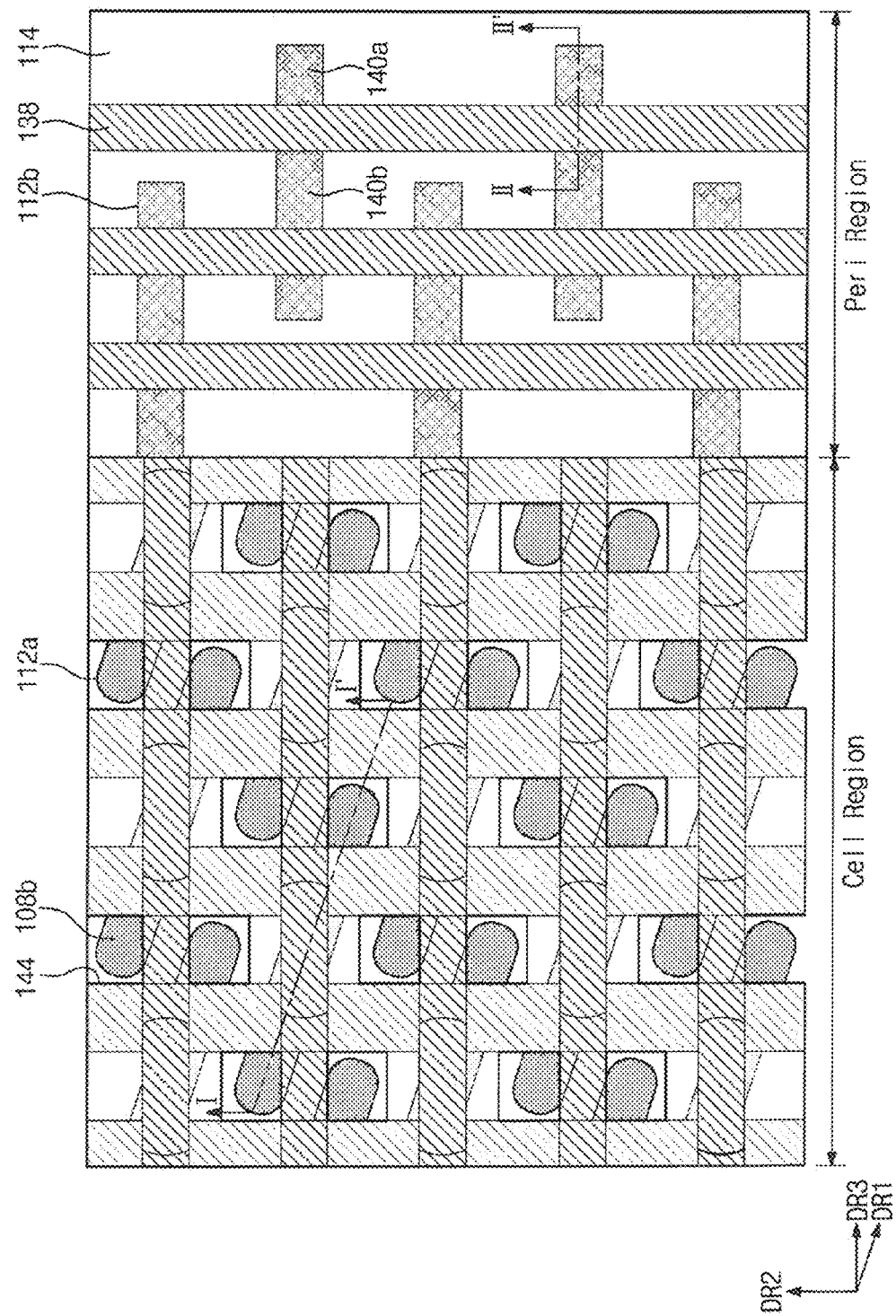

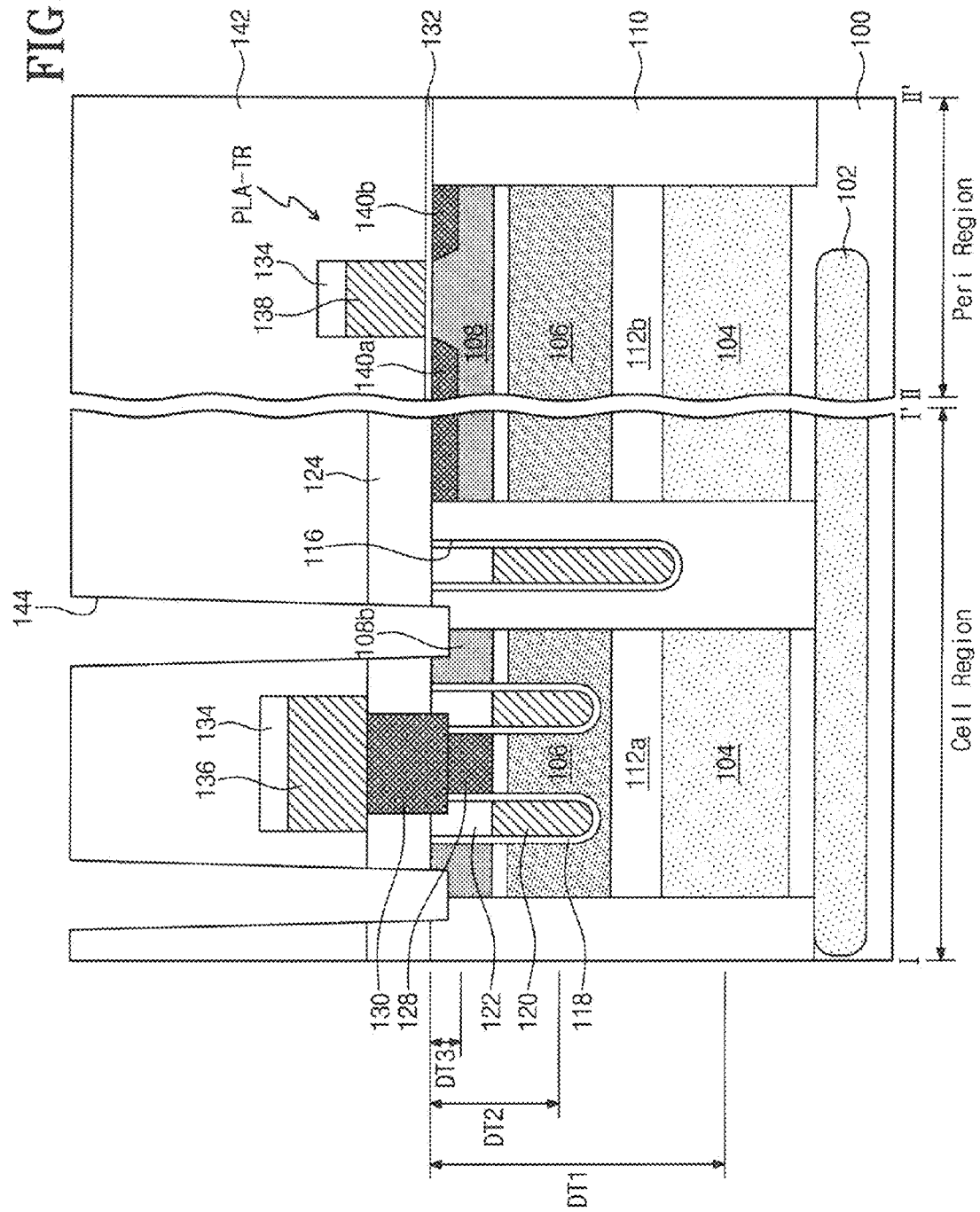

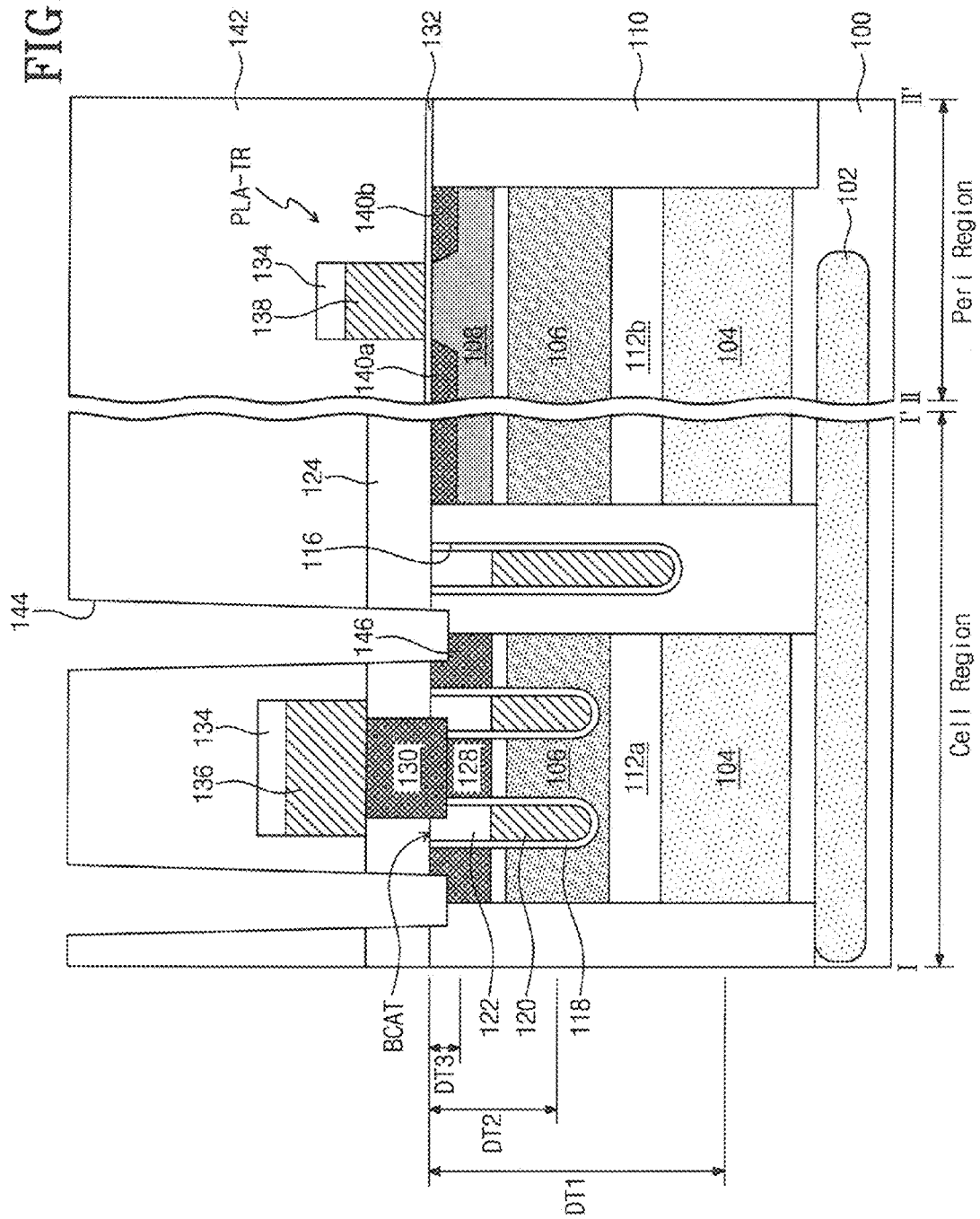

METHODS OF FABRICATING SEMICONDUCTOR DEVICES

CROSS-REFERENCE TO RELATED APPLICATIONS

This U.S. non-provisional patent application claims priority under 35 U.S.C. §119 to Korean Patent Application No. 10-2014-0186308, filed on Dec. 22, 2014, the disclosure of which is hereby incorporated by reference as if set forth in its entirety.

BACKGROUND OF THE INVENTIVE CONCEPT

The inventive concepts relate to methods of fabricating a semiconductor device, and more particularly, to semiconductor devices including a BCAT (buried channel array transistor) and a planar transistor.

Semiconductor devices include a memory devices that are configured to store data, logical devices that perform arithmetic operations on data, and hybrid devices that are capable of performing various functions at the same time.

As the electronic industry continues to develop, the demand for ever more highly integrated semiconductor devices increases. However, the increased level of integration leads to fabrication problems, due to the reduced process margins in exposure processes used to define fine patterns. This makes the realization of semiconductor devices more and more difficult. The demand for increased speed of semiconductor devices also continues to increase.

SUMMARY

Embodiments of the inventive concepts provide methods of fabricating semiconductor devices. The fabricating methods may include forming a first impurity region in a substrate by implanting a first impurity of a first conductivity type in a cell region and a peripheral region of the substrate to a first target depth from a top surface of the substrate; forming a second impurity region in the cell region and the peripheral region by implanting a second impurity of the first conductivity type into the cell region and the peripheral region to a second target depth that is smaller than the first depth from the top surface of the substrate; forming a cell transistor with a channel in the cell region, wherein the first impurity region forms the channel of the cell transistor; and forming a peripheral transistor with a channel in the peripheral region, wherein the second impurity region forms the channel of the peripheral transistor.

In example embodiments, the methods may further include forming a device isolation layer defining a cell active pattern in the cell region and defining a peripheral active pattern in the peripheral region.

In example embodiments, forming the cell transistor may include forming a recess crossing the cell active pattern and the device isolation layer; forming a cell gate insulating layer in the recess; forming a cell gate electrode on the cell gate insulating layer to fill a lower portion of the recess; forming a cell capping pattern on the cell gate electrode to fill an upper portion of the recess; and forming a cell source/drain region by implanting a third impurity of a second conductivity type different from the first conductivity type into the cell active pattern adjacent to both sides of the cell gate electrode.

In example embodiments, a bottom surface of the recess may substantially have the same depth as the first target location.

In example embodiments, forming the cell source/drain region may include forming an interlayer insulating layer including a contact hole exposing the cell active pattern adjacent to both sides of the cell capping pattern; and forming the cell source/drain region by implanting the third impurity of the second conductivity type into the cell active pattern exposed by the contact hole.

In example embodiments, forming the cell source/drain region may include forming an interlayer insulating layer including a contact hole exposing the cell active pattern adjacent to both sides of the cell capping pattern; forming a contact plug by filling the contact hole with polysilicon doped with the third impurity of the second conductivity type; and forming the cell source/drain region by diffusing the third impurity of the second conductivity type in the contact plug into the cell active pattern adjacent to the both sides of the cell capping pattern.

In example embodiments, forming the peripheral transistor may include forming a peripheral gate insulating layer on the peripheral region of the substrate; forming a peripheral gate electrode on the gate insulating layer; and forming a peripheral source/drain region by implanting a fourth impurity of the second conductivity type into the peripheral active pattern adjacent to both sides of the peripheral gate electrode.

In example embodiments, the method may further include forming a bit line electrically connected to one of the cell source/drain regions of the cell region, and the bit line may be formed in concurrence with the peripheral gate electrode.

Further embodiments of the inventive concept provide fabricating methods of a semiconductor device. The fabricating methods may include forming a first channel region in a cell region of a substrate; forming a second channel region in a peripheral region of the substrate; forming a cell transistor with the first channel region in the cell region; and forming a peripheral transistor with the second channel region in the peripheral region, wherein forming the first and second channel regions includes successively implanting first and second impurity ions of a first conductivity type do different depths in the substrate without a mask.

In example embodiments, forming the first channel region in the cell region may include implanting the first impurity ions into the substrate wherein a peak concentration of the first impurity ions is spaced a first depth apart from a top surface of the substrate; and diffusing the first impurity ions to form a first impurity region.

In example embodiments, forming the second channel region in the peripheral region may include implanting the second impurity ions into the substrate to a second depth that is smaller than the first depth; and diffusing the second impurity ions to form a second impurity region.

In example embodiments, forming the cell transistor in the cell region may include forming a recess in cell region of the substrate; forming a cell gate insulating layer in the recess; forming a cell gate electrode on the cell gate insulating layer in a lower portion of the recess; forming a cell capping pattern on the cell gate electrode in an upper portion of the recess; and forming a cell source/drain region by implanting a third impurity of a second conductivity type different from the first conductivity type into a cell active pattern adjacent to both sides of the cell gate electrode.

In example embodiments, forming the peripheral transistor in the peripheral region may include forming a peripheral gate insulating layer on the peripheral region; forming a peripheral gate electrode on the gate insulating layer; and forming a peripheral source/drain region by implanting a fourth impurity of the second conductivity type into a peripheral active pattern adjacent to both sides of the peripheral gate electrode.

A method of fabricating a semiconductor device according to further embodiments includes providing a semiconductor substrate including a cell region and a peripheral region; implanting impurity ions of a first conductivity type in the cell region and the peripheral region to a first depth from a top surface of the substrate to form a first impurity region in the substrate; implanting second impurity ions of the first conductivity type into the cell region and the peripheral region to a second depth from the top surface of the substrate that is smaller than the first depth to form a second impurity region in the substrate; forming a recess in the cell region extending through the second impurity region and into the first impurity region; forming a cell gate insulating layer in the recess; forming a gate electrode in the recess, wherein the gate electrode is spaced apart from the first impurity region by the cell gate insulating layer; forming a peripheral gate insulating layer on the upper surface of the substrate in the peripheral region; and forming a peripheral gate electrode on the peripheral gate insulating layer.

The method may further include implanting third impurity ions of the first conductivity type into the cell region and the peripheral region to a third depth from the top surface of the substrate that is larger than the first depth to form a third impurity region in the substrate.

In some embodiments, the method may further include implanting fourth impurity ions of a second conductivity type that is different from the first conductivity type into the cell region and the peripheral region to a fourth depth from the top surface of the substrate that is larger than the third depth to form a well region in the substrate.

The method may further include forming a device isolation layer defining a cell active pattern in the cell region and defining a peripheral active pattern in the peripheral region. Forming the recess in the cell region may include forming a first recess in the cell active pattern and forming a second recess in the device isolation layer.

Forming the cell gate insulating layer may include forming a first cell gate insulating layer in the first recess and forming a second cell gate insulating layer in the second recess; and forming the cell gate electrode may include forming a first cell gate electrode in the first recess and forming a second cell gate electrode in the second recess. The second recess may be deeper than the first recess.

The well region may extend below the device isolation layer from the cell region to the peripheral region.

BRIEF DESCRIPTION OF THE FIGURES

Embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

FIGS. 1A through 14A are top plan views that illustrate fabricating methods of a semiconductor device in accordance with embodiments of the inventive concept.

FIGS. 1B through 14B are cross sectional views that illustrate fabricating methods of a semiconductor device in accordance with embodiments of the inventive concept.

DETAILED DESCRIPTION OF PREFERRED EMBODIMENTS

Figure 1A:
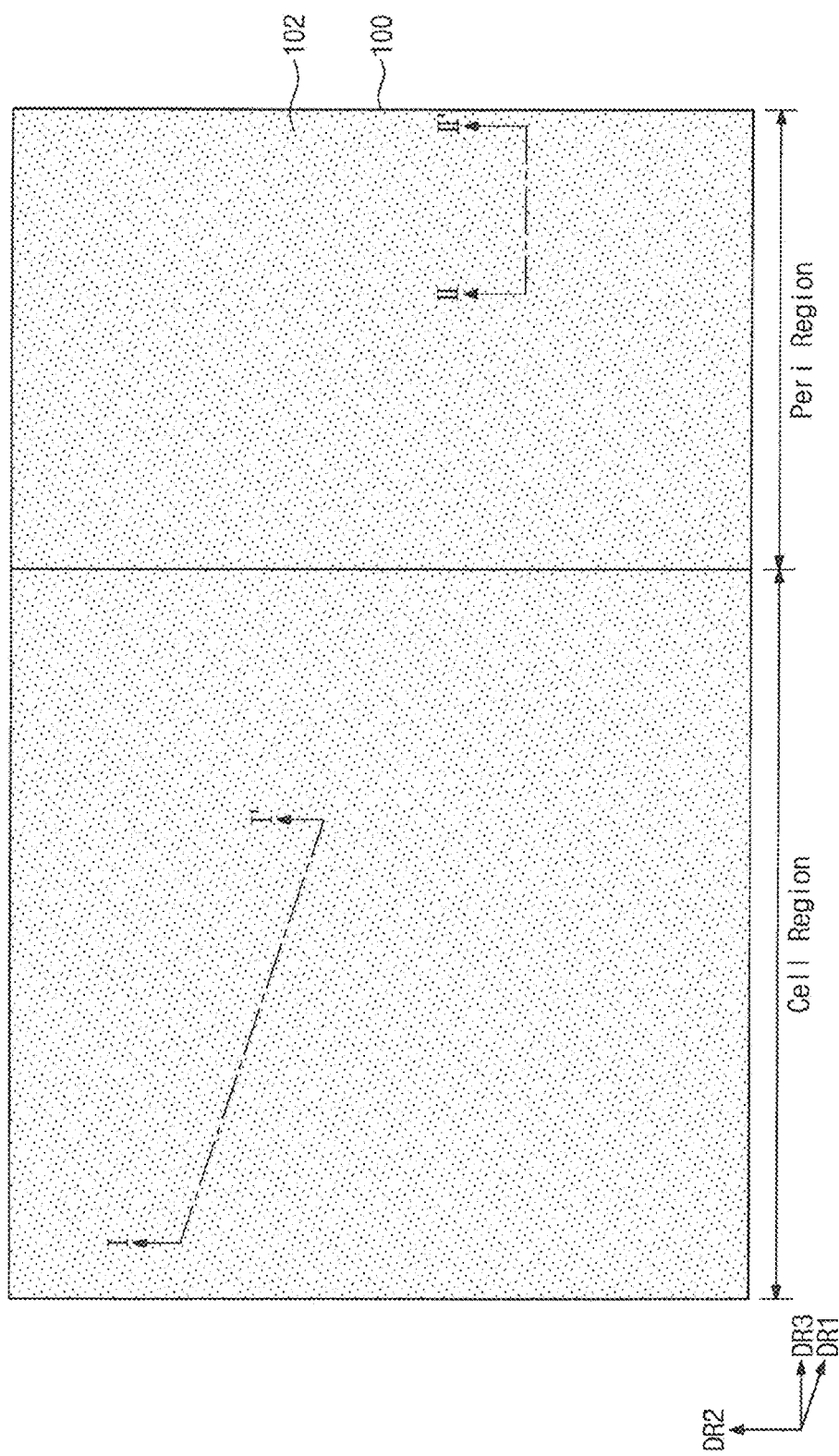

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will also be understood that when an element such as a layer, region or substrate is referred to as being "on" or "onto" another element, it may lie directly on the other element or intervening elements or layers may also be present.

Embodiments of the inventive concept may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

FIGS. 1A through 14A are top plan views that illustrate fabricating methods of a semiconductor device in accordance with embodiments of the inventive concepts. FIGS. 1B through 14B are cross sectional views that illustrate fabricating methods of a semiconductor device in accordance with embodiments of the inventive concepts.

Figure 1B:
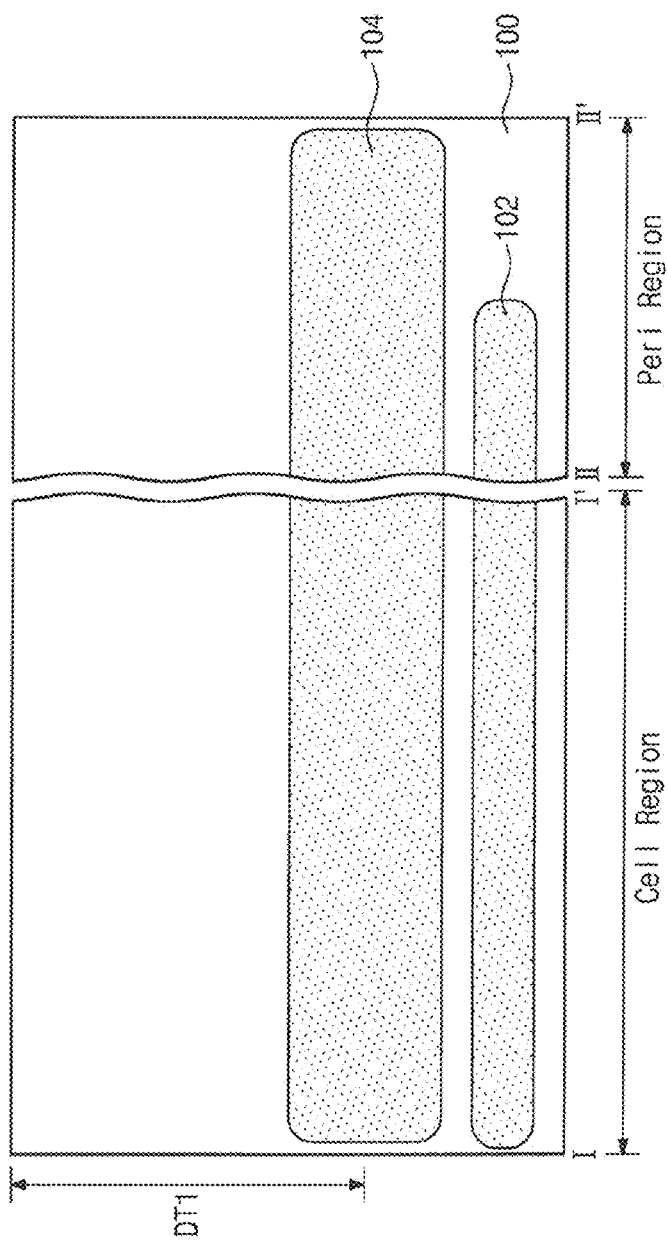

Referring to FIGS. 1A and 1B, first impurities of a first conductivity type may be implanted into a substrate 100 to form a first impurity region 104 in both a cell region and a peripheral region of the substrate. The first conductivity type may be n-type or p-type.

According to one aspect of the inventive concept, the substrate 100 may include a cell region in which memory cells are formed and a peripheral region in which logic cells are formed. According to an embodiment of the inventive concept, memory cells in the cell region may include a BCAT (buried channel array transistor). The logic cells in the peripheral region may include a planar transistor.

The substrate 100 may be a semiconductor substrate 100 including silicon and/or germanium. The ionized first impurity ions of the first conductivity type may be implanted to a first target depth in the substrate 100 and then diffuse to form a first impurity region 104. The first impurity region 104 may include a region which extends above and below the first target depth. The first impurity region 104 may be formed over an entirety of the cell region and the peripheral region without a mask process. That is, the first impurity region 104 may be formed by a blanket implant process.

The first impurity region 104 may be formed such that a peak concentration of impurity ions that form the first impurity region 104 is spaced a first depth DT1 apart from a top surface of the substrate 100. The first depth DT1 may be a distance between the top surface of the substrate 100 and the first target location.

The first impurity region 104 may function as a well region of transistors which are subsequently formed. For example, in the case that the transistor is an NMOS, the well region may include p-type first impurity. The first impurity region 104 may have a multilayer structure.

According to one aspect of the inventive concept, a well region 102 of a second conductivity type that is different from the first conductivity type may be further formed below the first impurity region 104 (i.e. at a greater depth from the surface of the substrate 100 as the first impurity region 104). The second conductivity type may be p-type or n-type. For example, when the first conductivity type is n-type, the second conductivity type may be p-type. The well region 102 may function as a well region of the first impurity region 104. The well region 102 may be formed in the cell region and also at least partly in the peripheral region.

Figure 2A:
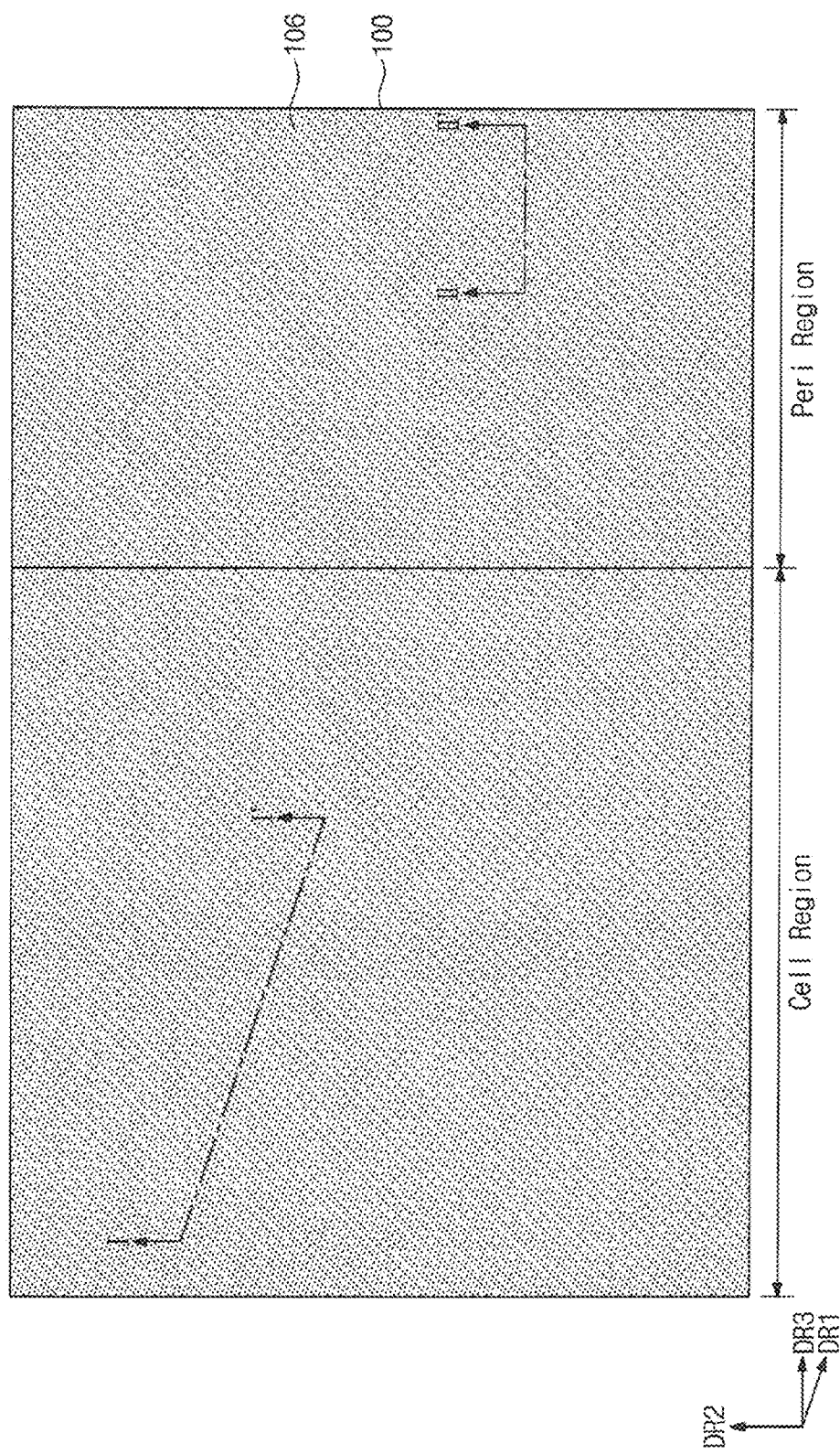
Figure 2B:
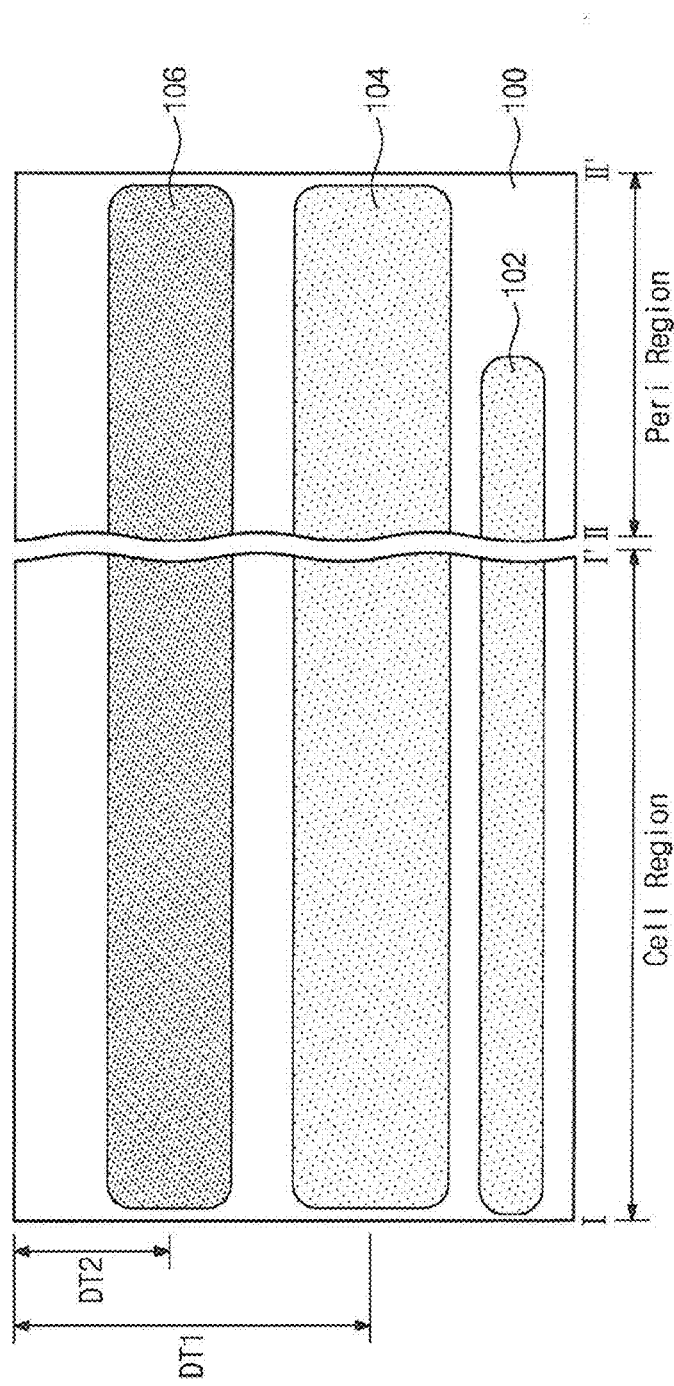

Referring to FIGS. 2A and 2B, a second impurity region 106 may be formed by implanting second impurities of the first conductivity type into the substrate 100.

Impurity ions of the first conductivity type may be implanted to a second target depth in the substrate 100, and may then diffuse to form the second impurity region 106. The second impurity region 106 may include a region which extends above and below the second target depth. The second impurity region 106 may be formed over the entirety of the cell region and the peripheral region without a mask process.

The second impurity region 106 may be disposed between the top surface of the substrate 100 and the first impurity region 104. A peak concentration of the impurity ions that form the second impurity region 106 may be spaced a second depth DT2 apart from the top surface of the substrate 100. The second depth DT2 may be a distance between the top surface of the substrate 100 and the second target depth. That is, the second depth DT2 may be smaller than the first depth DT1.

The second depth DT2 may correspond to a peak concentration of the impurity ions in the second impurity region 106.

The second impurity region 106 may function as a channel region of BCAT (buried channel array transistor) of the cell region which is subsequently to be formed.

Figure 3A:
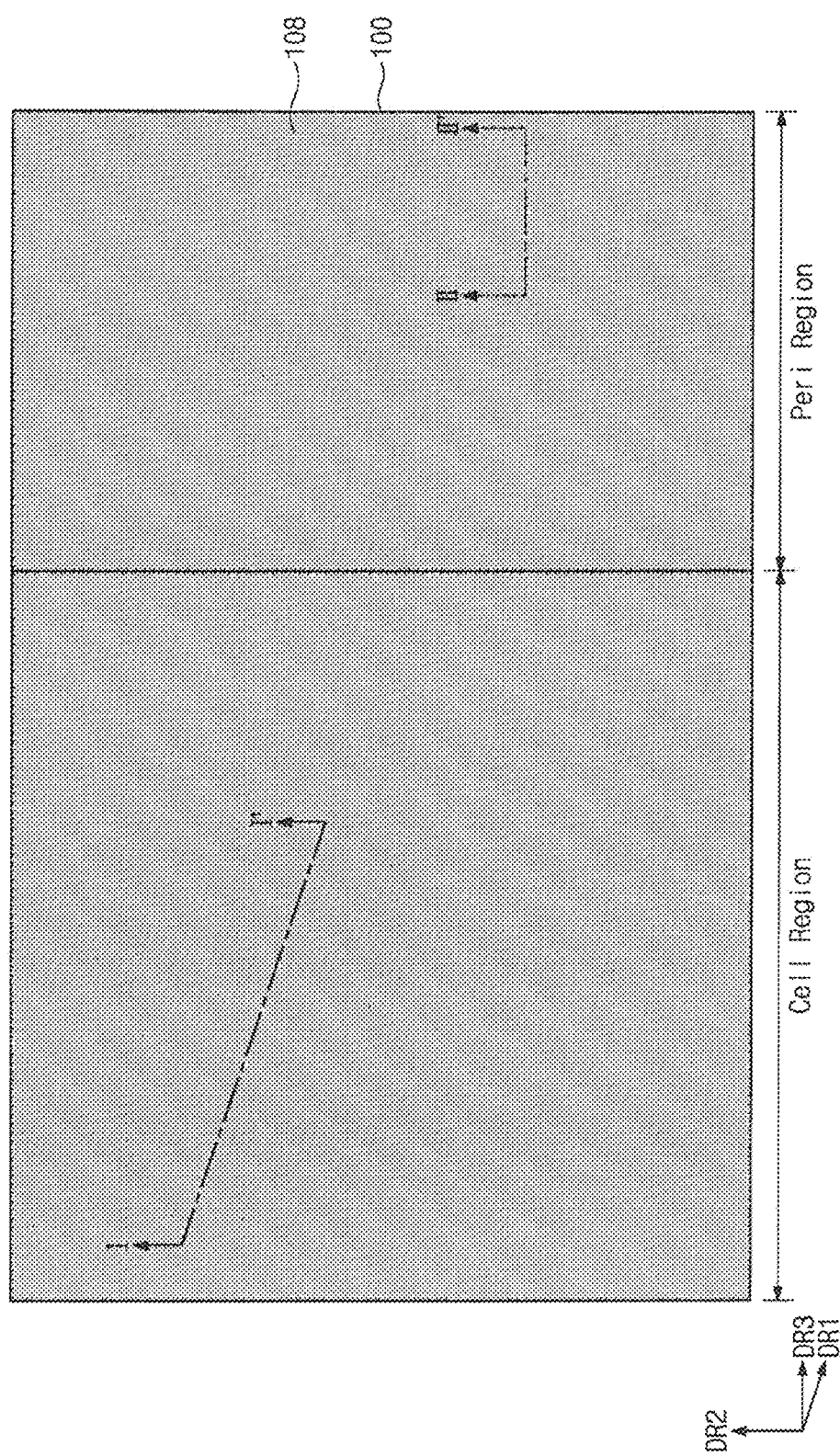
Figure 3B:
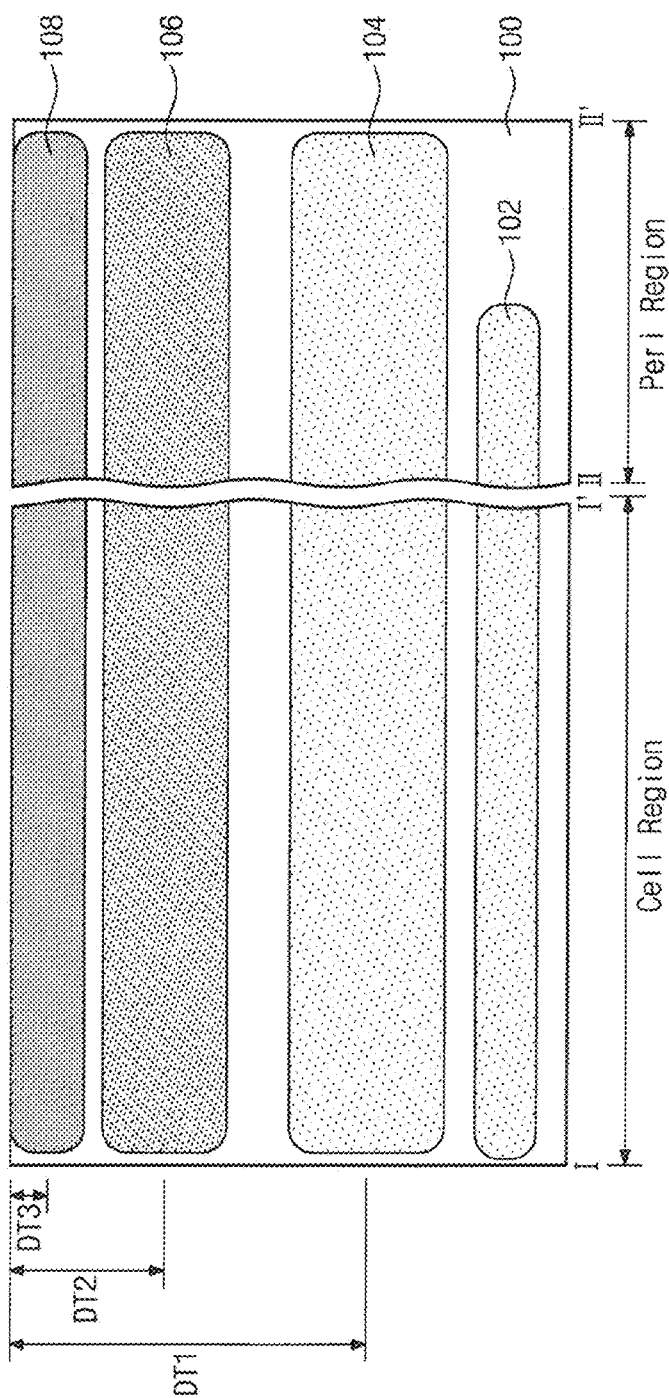

Referring to FIGS. 3A and 3B, a third impurity region 108 may be formed by implanting third impurities of the first conductivity type into the substrate 100.

The ionized third impurity ions of the first conductivity type may be implanted to a third target depth in the substrate 100, and may then diffuse to form the third impurity region 108. The third impurity region 108 may include a region which extends above and below the third target depth DT3. The third impurity region 108 may be formed over the whole of the cell region and the peripheral region without a mask process.

The third impurity region 108 may be spaced a third depth DT3 apart from the top surface of the substrate 100. The third depth DT3 may be a distance between the top surface of the substrate 100 and the third target location. The third depth DT3 may be smaller than the second depth DT2. For instance, the third impurity region 108 may be formed adjacent to the top surface of the substrate 100. The third depth DT3 may correspond to a peak concentration of the impurity ions in the third impurity region 108.

The third impurity region 108 may function as a channel region of a planar transistor that is subsequently formed in the peripheral region.

According to some aspects of the inventive concepts, adjacent impurity regions of the first, second and third impurity regions 104, 106 and 108 may overlap each other in a horizontal direction. That is the first, second and third impurity regions 104, 106 and 108 may each extend laterally into both the cell region and the peripheral region. According to other aspects of the inventive concepts, the first, second and third impurity regions 104, 106 and 108 may be vertically spaced apart from one another.

Figure 4B:
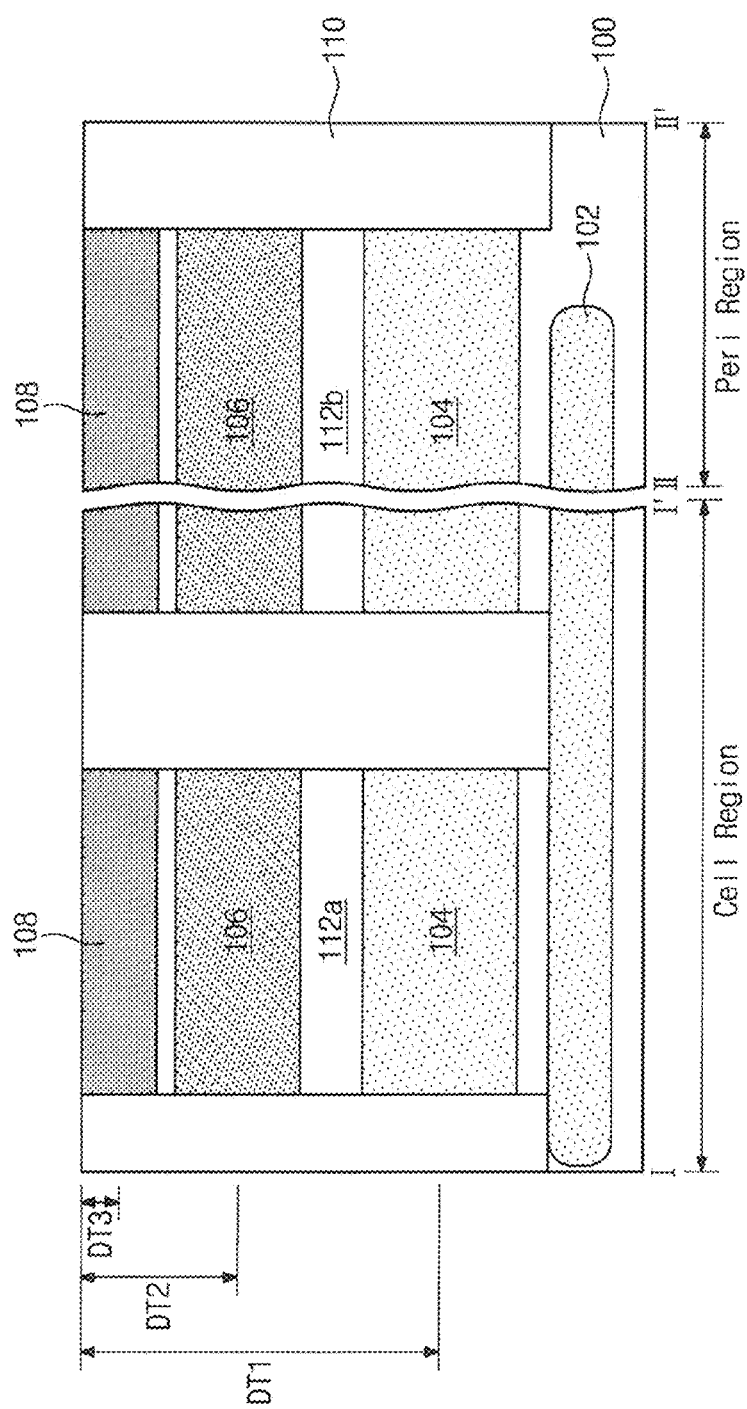

Referring to FIGS. 4A and 4B, a device isolation layer 110 defining active patterns may be formed in the substrate 100.

The substrate 100 is etched to form a trench and then an insulating material is formed in the trench to form the device isolation layer 110. The device isolation layer 110 may have a multilayer structure. For instance, the device isolation layer 110 may include an oxide thin layer, a nitride thin layer and a buried oxide layer which are sequentially formed.

In the embodiments illustrated in FIGS. 4A and 4B, the active patterns may include a cell active pattern 112a located in the cell region and a peripheral active pattern 112b located in the peripheral region.

Although in the embodiments illustrated in FIGS. 4A and 4B, the device isolation layer 110 is formed after the first, second and third impurity regions 104, 106 and 108 are formed, at least one of the first, second and third impurity regions 104, 106 and 108 may be formed after forming the device isolation layer 110. That is, the inventive concept does not limit the order of formation of the device isolation layer 110 and the first, second and third impurity regions 104, 106 and 108.

According to some aspects of the inventive concepts, the cell active patterns 112a may have an elliptical shape extending along a first direction DR1 which is a major axis direction of the cell active pattern 112a. The cell active patterns 112a may be disposed to be spaced apart from one another along the first direction DR1 and a second direction DR2. The cell active patterns 112a may have a structure in which one cell active pattern 112a spaced apart along the second direction DR2 is disposed between two cell active patterns 112a spaced apart from each other along the first direction DR1. The peripheral active patterns 112b may have various structures depending on the type of logic cells being formed.

The structures of the cell active pattern 112a and the peripheral active pattern 112b of the inventive concept are not limited to the structures illustrated in FIGS. 4A and 4B.

Figure 5B:
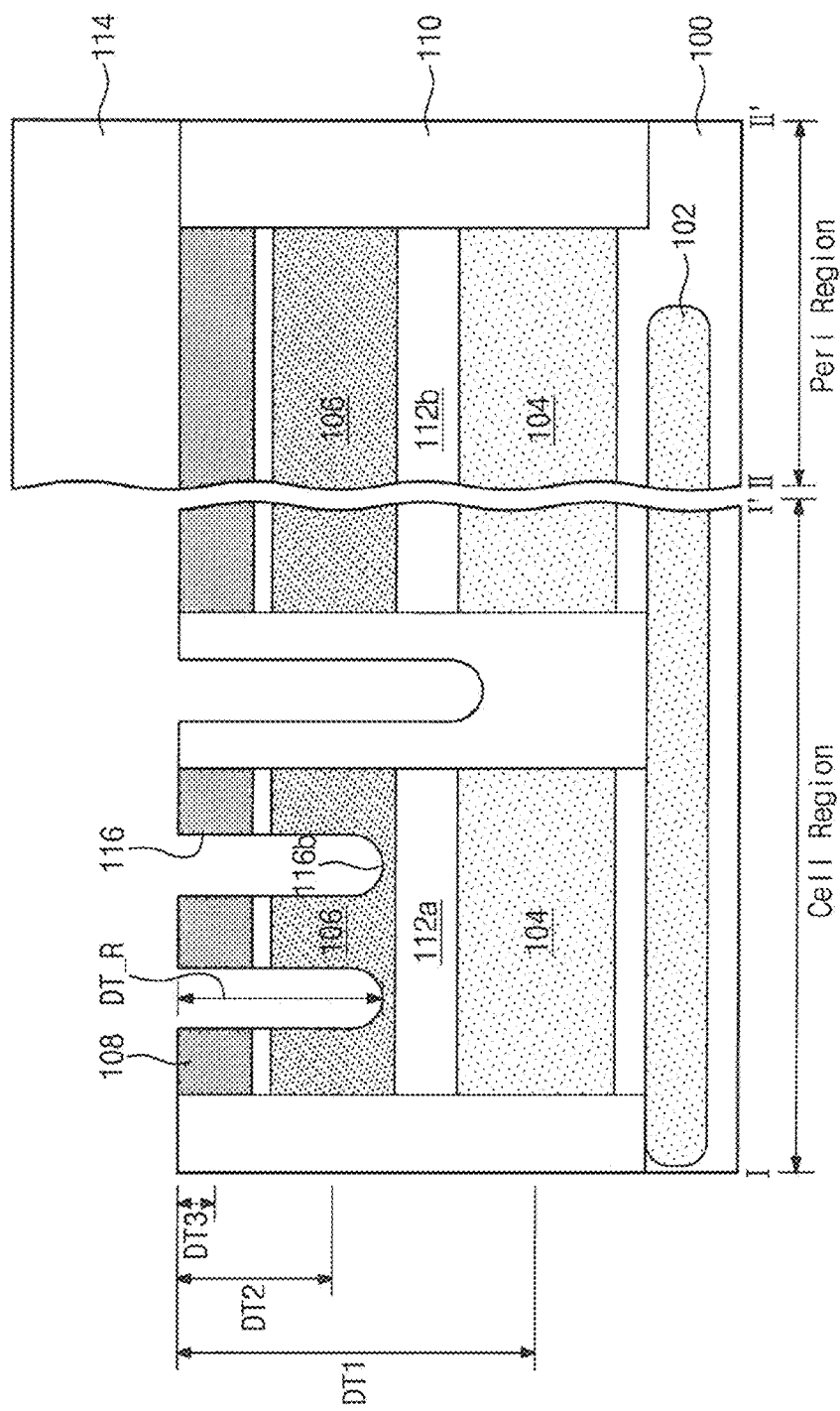

Referring to FIGS. 5A and 5B, the peripheral region is covered with a mask 114, and then recesses 116 crossing the device isolation layer 110 and the cell active patterns 112a in the second direction DR2 may be formed in the cell region.

Each recess 116 has a bottom surface 116b. A distance DT_R between the top surface of the substrate 100 and the bottom surface of the recess 116 may be substantially the same as the second depth DT2. In another embodiment, the distance DT_R between the top surface of the substrate 100 and the bottom surface of the recess 116 may be smaller or greater than the second depth DT2. The second impurity region 106 may be exposed by the bottom surface of the recess 116. As described above, the second impurity region 106 exposed by the recess 116 may function as a channel region of BCAT of the cell region which is subsequently formed.

According to some aspects of the inventive concepts, the portion of the recess 116 formed in the device isolation layer 110 of the cell region may be deeper than the portion of the recess 116 formed in the cell active pattern 112a.

Figure 6B:
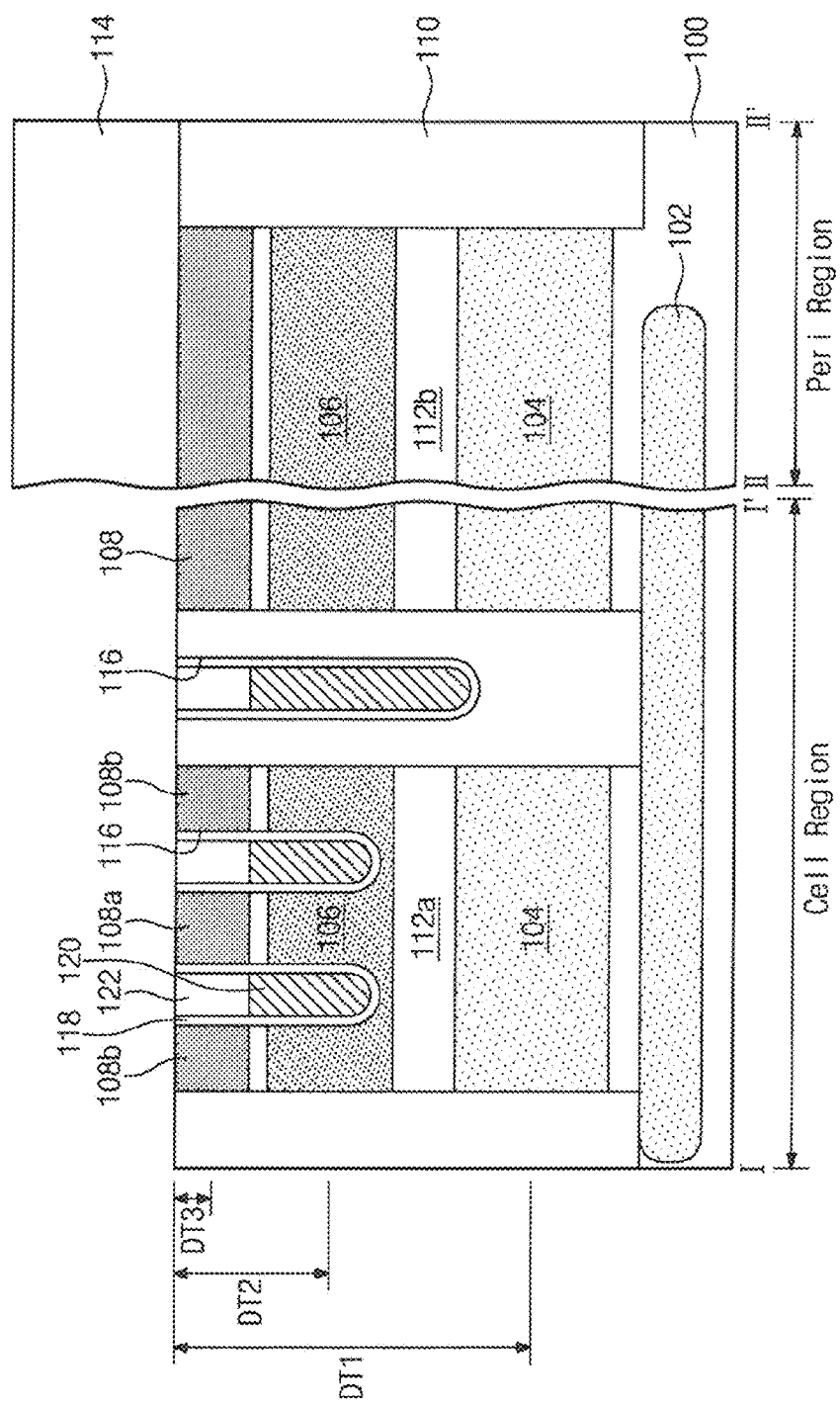

Referring to FIGS. 6A and 6B, a cell gate insulating layer 118, a cell gate electrode 120 and a first capping pattern 122 may be formed in each recess 116. The peripheral region may be covered with the mask 114 while the cell gate insulating layer 118, the cell gate electrode 120 and the first capping pattern 122 are formed.

The cell gate insulating layer 118 may be conformally formed on the cell region of the substrate 100 in which the recess 116 is formed and the cell gate insulating layer 118 may not fully fill the recess 116. The cell gate insulating layer 118 may include metallic oxide such as silicon oxide, hafnium oxide, or aluminum oxide, etc.

The cell gate electrode 120 may be formed in a lower portion of the recess 116 in which the cell gate insulating layer 118 is formed. The cell gate electrode 120 may include metal such as tungsten or copper, or polysilicon doped with an impurity of the first conductivity type.

The first capping pattern 122 may be formed on the cell gate electrode 120 to fill an upper portion of the recess 116. The first capping pattern 122 may include a material having an etching selectivity with respect to the substrate 100 and the device isolation layer 110. For instance, the first capping pattern 122 may include silicon nitride. According to one aspect of the inventive concept, a top surface of the first capping pattern 122 may be coplanar with a top surface of the substrate 100.

The two cell gate electrodes 120 may be formed to cross the one cell active pattern 112a. A part of the cell active pattern 112a being exposed between the two cell gate electrodes 120 is called a first region 108a and parts of the cell active pattern 112a being exposed at the outer parts of the two cell gate electrodes 120 are called a second region 108b. As described above, the first and second regions 108a and 108b may be regions doped with the third impurity of the first conductivity type.

Figure 7A:
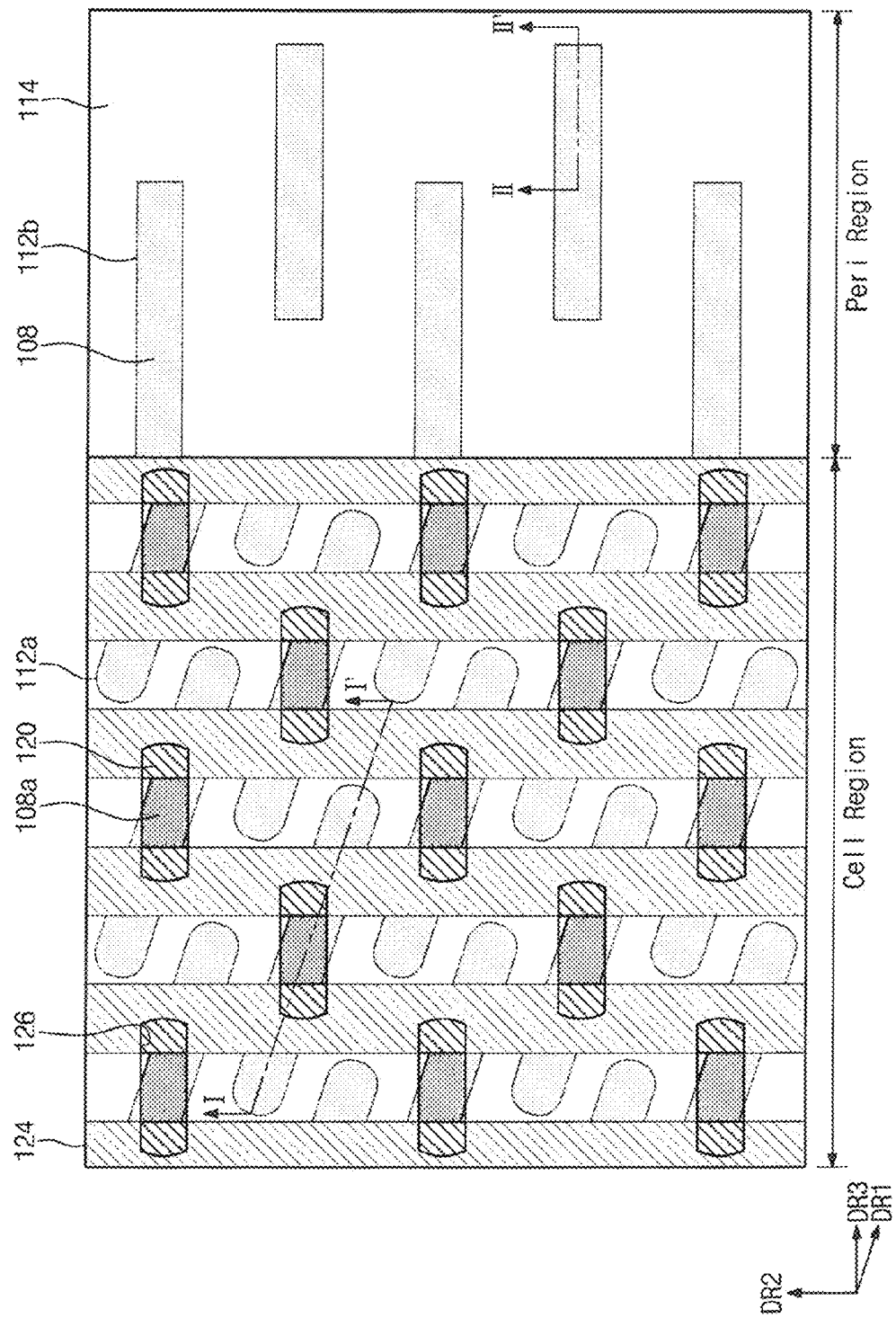

Referring to FIGS. 7A and 7B, a first interlayer insulating layer 124 may be formed on the cell region. The first interlayer insulating layer 124 may be formed over the peripheral region. The first interlayer insulating layer 124 may include silicon nitride or silicon oxynitride. The first interlayer insulating layer 124 may include a first contact hole 126 exposing the first region 108a of the cell active pattern 112a. The first region 108a may include a region (the third impurity region 108) doped with the third impurity of the first conductivity type.

Figure 8B:
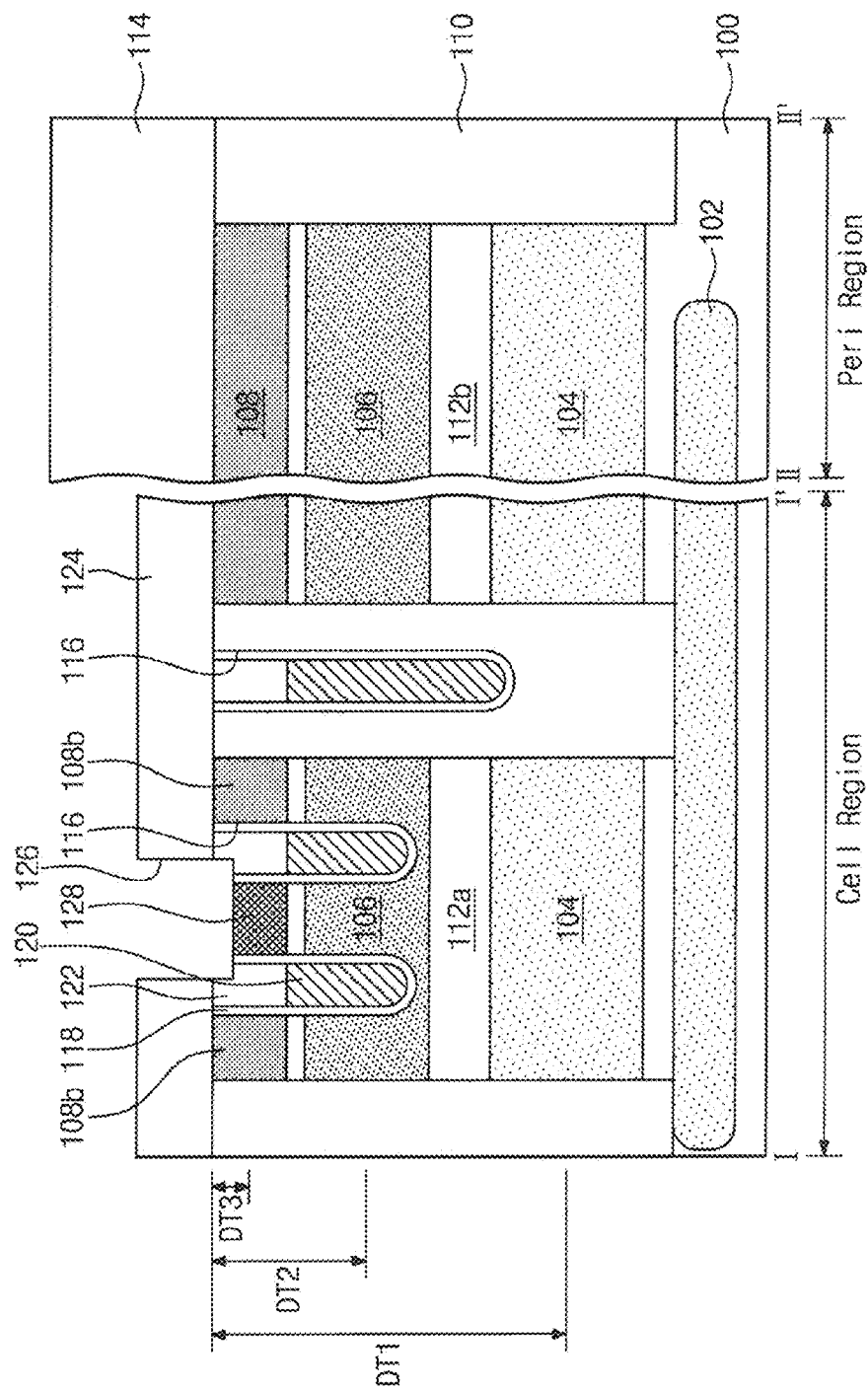

Referring to FIGS. 8A and 8B, a source region 128 (or a drain region) of the BCAT in the cell region may be formed by implanting an impurity having the second conductivity type into the first region 108a.

Figure 9A:
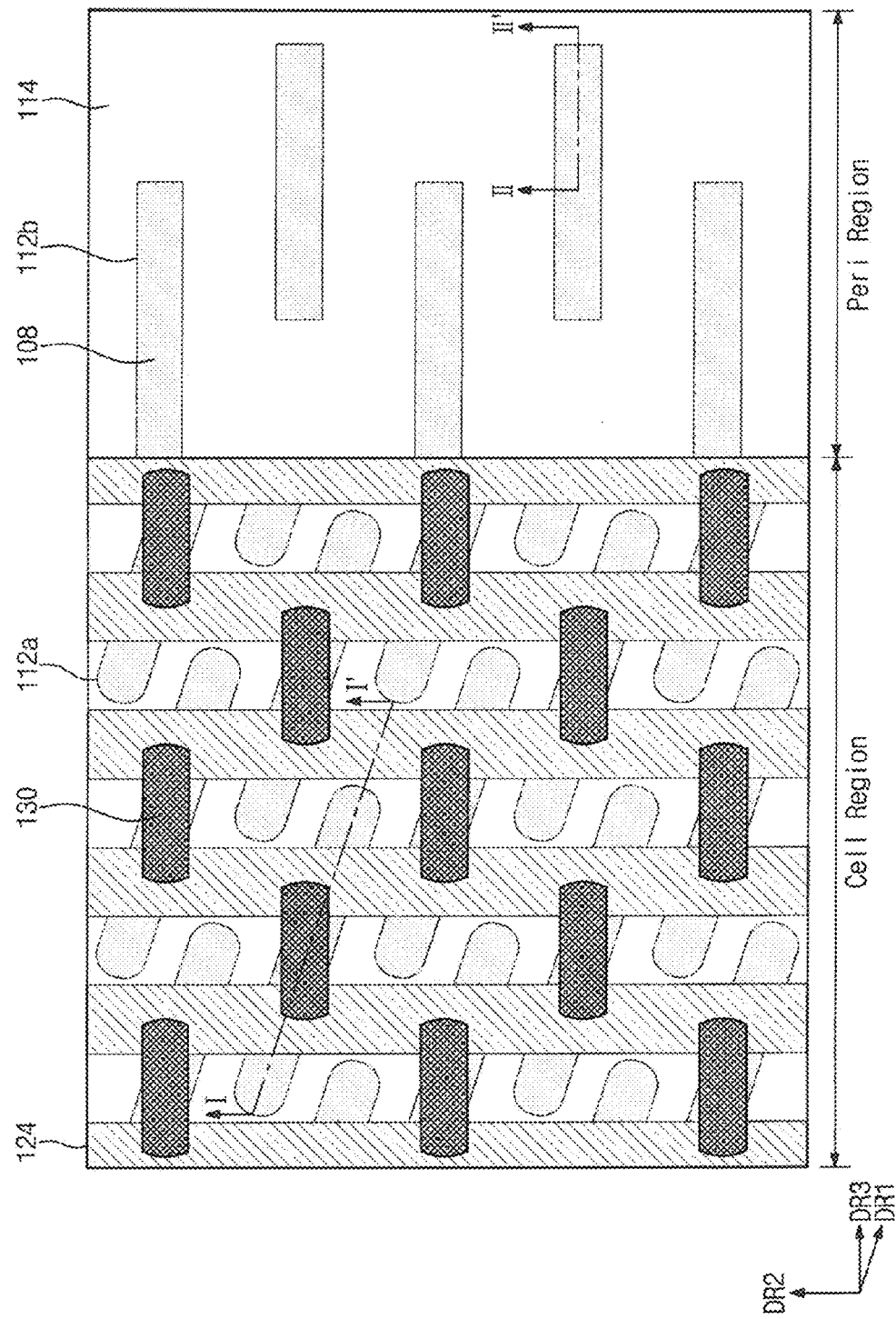
Figure 9B:
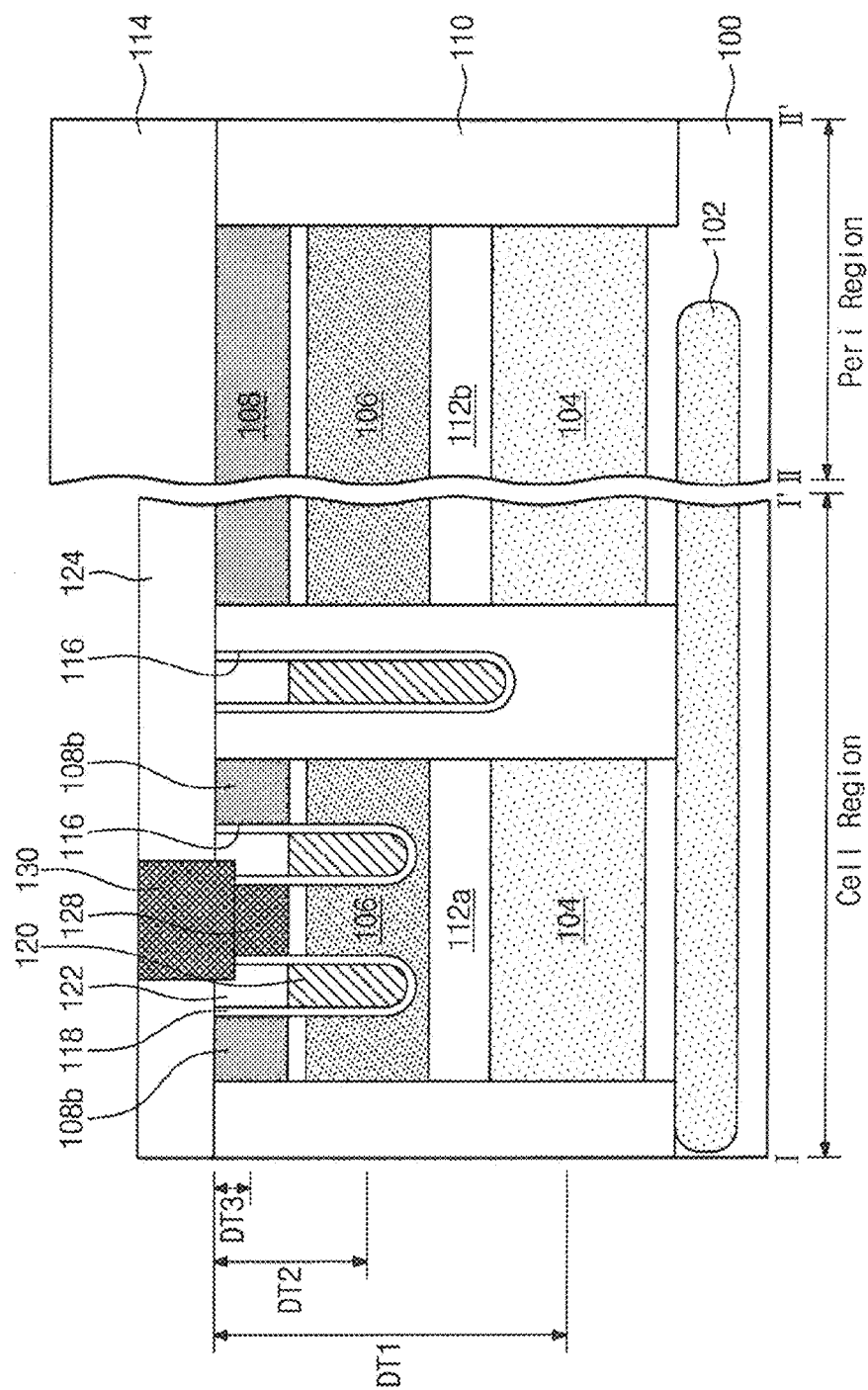

Referring to FIGS. 9A and 9B, a first contact plug 130 filling the first contact hole 126 of the first interlayer insulating layer 124 may be formed.

According to some aspects of the inventive concepts, the first contact plug 130 may include polysilicon having an impurity of the second conductivity type. In this case, the process of FIGS. 8A and 8B may be omitted. After forming the first contact plug 130, the impurity of the second conductivity type in the first contact plug 130 may diffuse into the first region 108a of the cell active pattern 112a. The first region 108a of the cell active pattern 112a with the impurity of the second conductivity type may form the cell source region 128 (or cell drain region) of the BCAT in the cell region.

According to other aspects of the inventive concepts, the first contact plug 130 may include a metal, such as tungsten, copper or silver. In this case, the process of FIGS. 8A and 8B may not be omitted.

Referring to FIGS. 10A and 10B, a bit line 136 electrically connected to the first contact plug 130 may be formed. The bit line 136 may extend in a third direction DR3 different from the first and second directions DR1 and DR2.

According to an embodiment of the inventive concept, after removing the mask 114 covering the peripheral region, a peripheral gate electrode 138 may be formed in the peripheral region while the bit line 136 is formed in the cell region.

According to some aspects of the inventive concepts, a peripheral gate insulating layer 132 is formed on the peripheral region and a conductive layer and a second capping pattern 134 may be sequentially formed on the peripheral gate insulating layer 132 and the first interlayer insulating layer 124. The conductive layer may include a metal, such as tungsten, silver or copper, or may include polysilicon including an impurity of the second conductivity type. The conductive layer is etched using the second capping pattern 134 as an etching mask to form the peripheral gate electrode 138 on the peripheral gate insulating layer 132 and the bit line 136 on the first interlayer insulating layer 124.

Figure 11A:
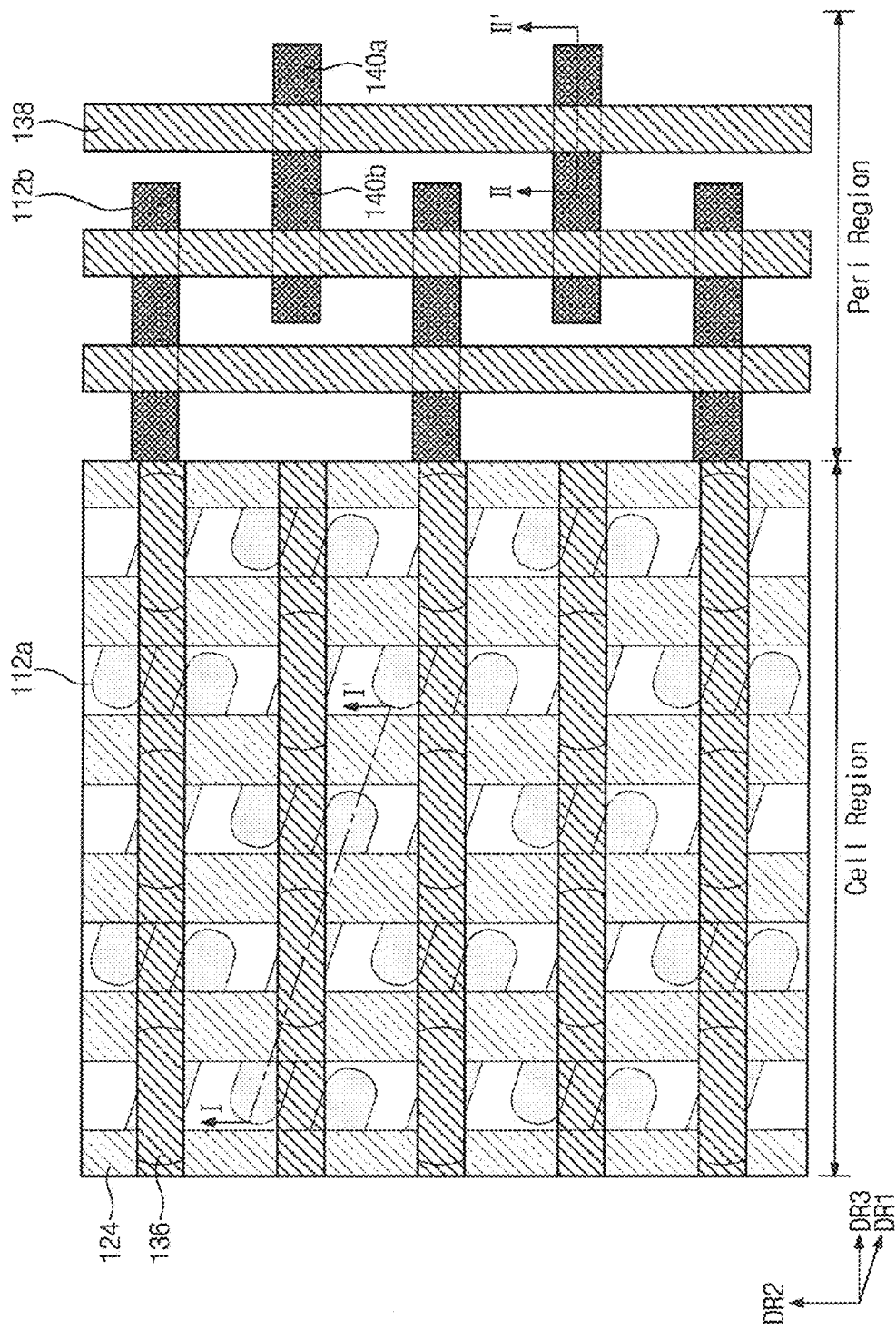
Figure 11B:
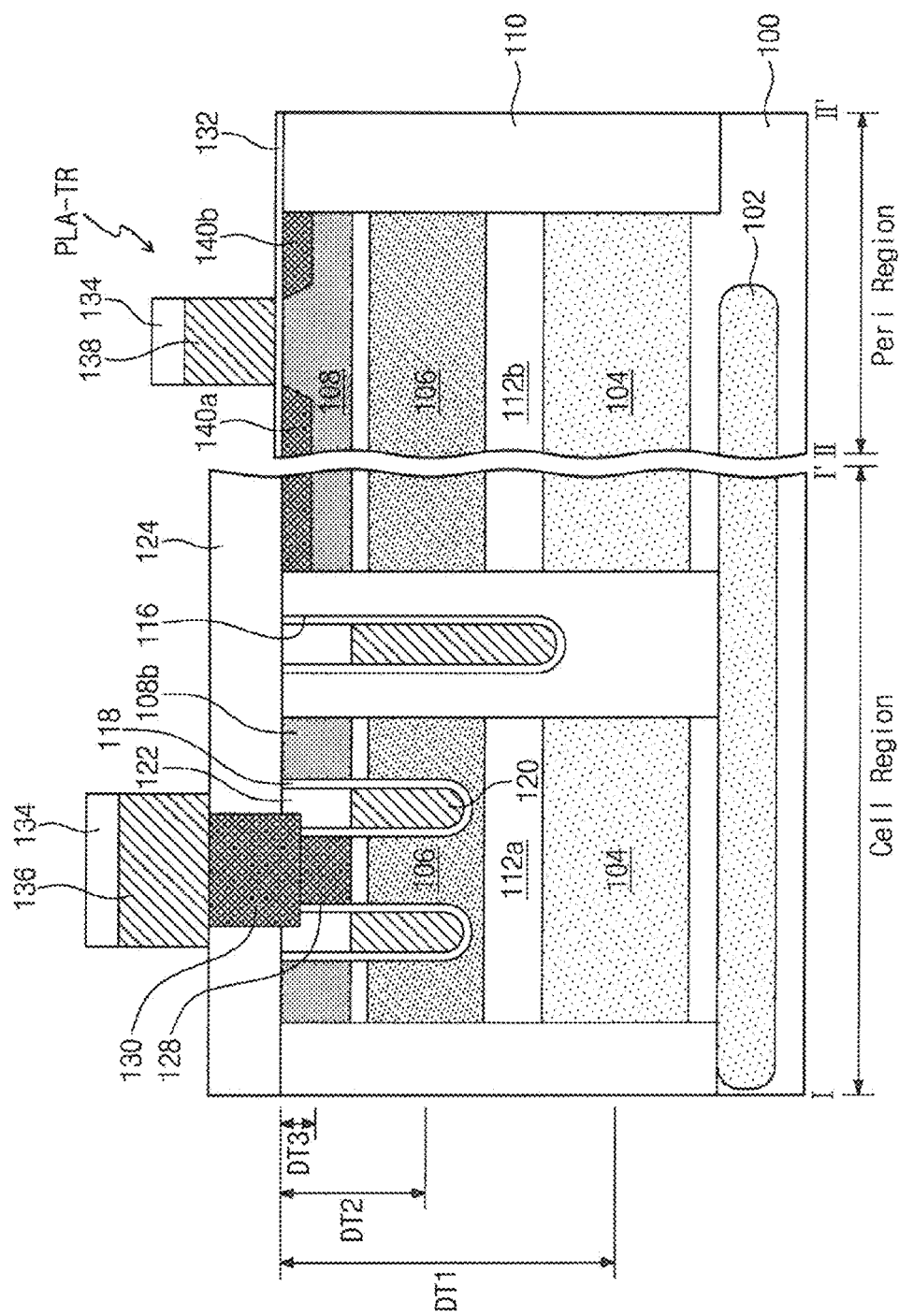

Referring to FIGS. 11A and 11B, the impurity of the second conductivity type is implanted into the peripheral active pattern 112b adjacent to the peripheral gate electrode 138 to form peripheral source/drain regions 140a and 140b.

By doing that, a planar transistor PLA_TR including the peripheral gate insulating layer 132, the peripheral gate electrode 138 and the peripheral source/drain regions 140a and 140b may be formed on the peripheral region. The peripheral source/drain regions 140a and 140b may be doped with an impurity of the second conductivity type. The portions of the peripheral active pattern 112b under the peripheral gate electrode 138 may be doped with an impurity of the first conductivity type to function as a channel region of the planar transistor PLA_TR.

In the embodiments of FIGS. 11A and 11B, the peripheral source/drain regions 140a and 140b are formed after forming the peripheral gate electrode 138 but the inventive concepts do not limit the order of formation of the peripheral source/drain regions 140a and 140b.

Referring to FIGS. 12A and 12B, a second interlayer insulating layer 142 may be formed on the bit line 136 and the planar transistor PLA_TR. The second interlayer insulating layer 142 may include silicon oxide or silicon oxynitride. The second interlayer insulating layer 142 may include a second contact hole 144 exposing the second region 108*b* of the cell active pattern 112*a*. The second region 108*b* may include a region (the third impurity region 108) doped with a third impurity of the first conductivity type.

Figure 13A:
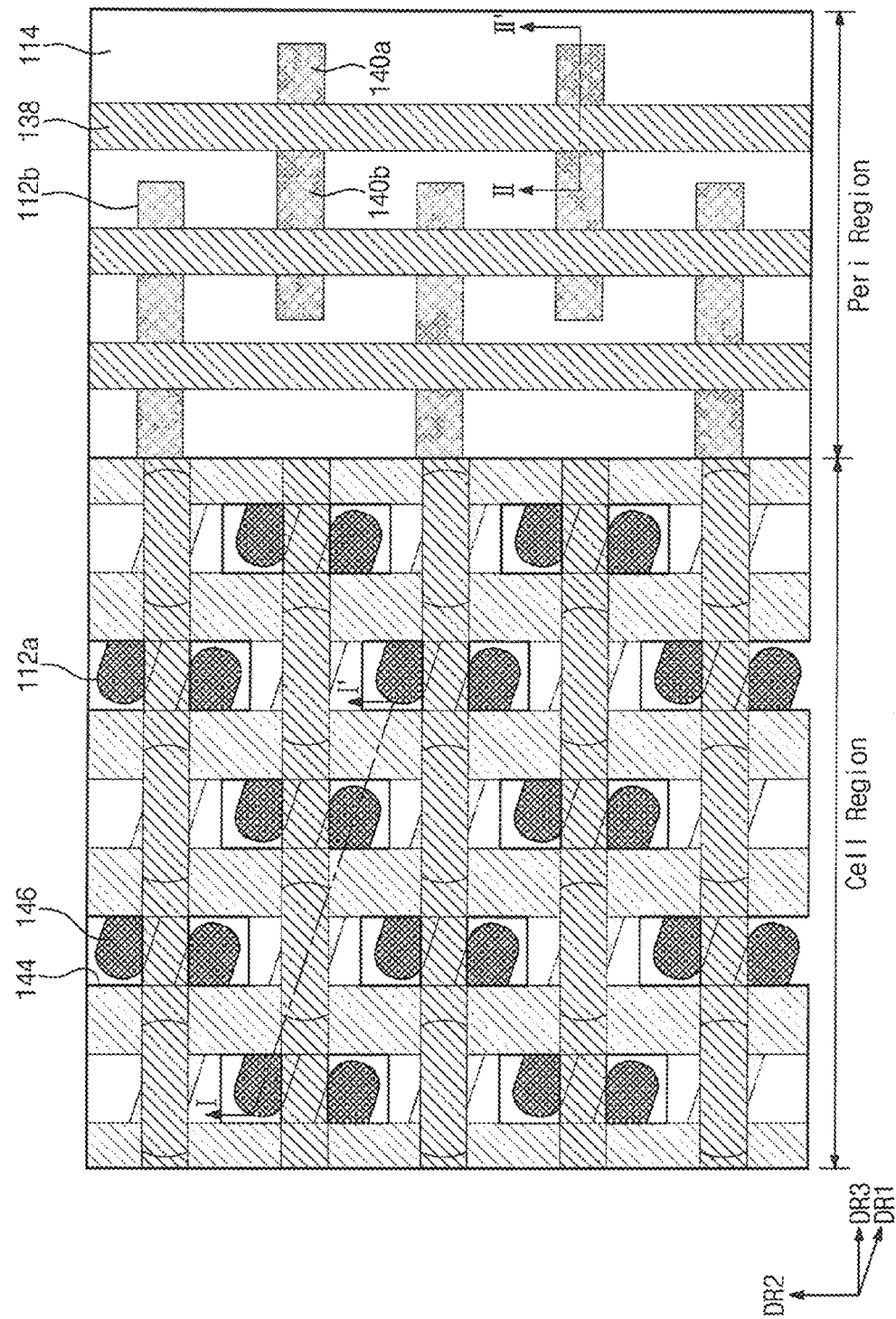

Referring to FIGS. 13A and 13B, an impurity of the second conductivity type may be implanted into the second region of the cell active pattern 112*a* exposed by the first contact hole 126 to form a cell drain region 146 (or cell source region) of the BCAT being completed on the cell region.

Figure 14A:
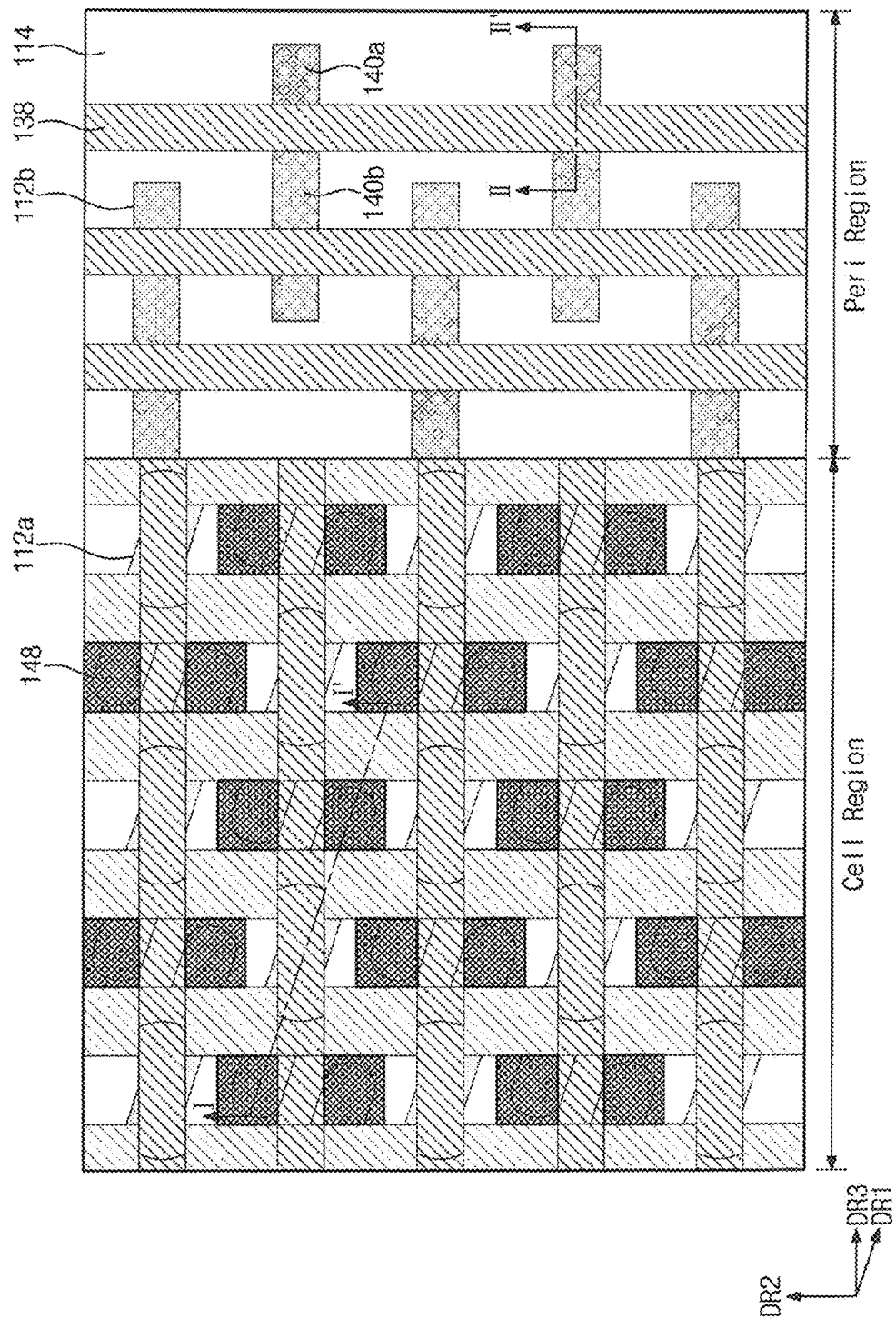
Figure 14B:
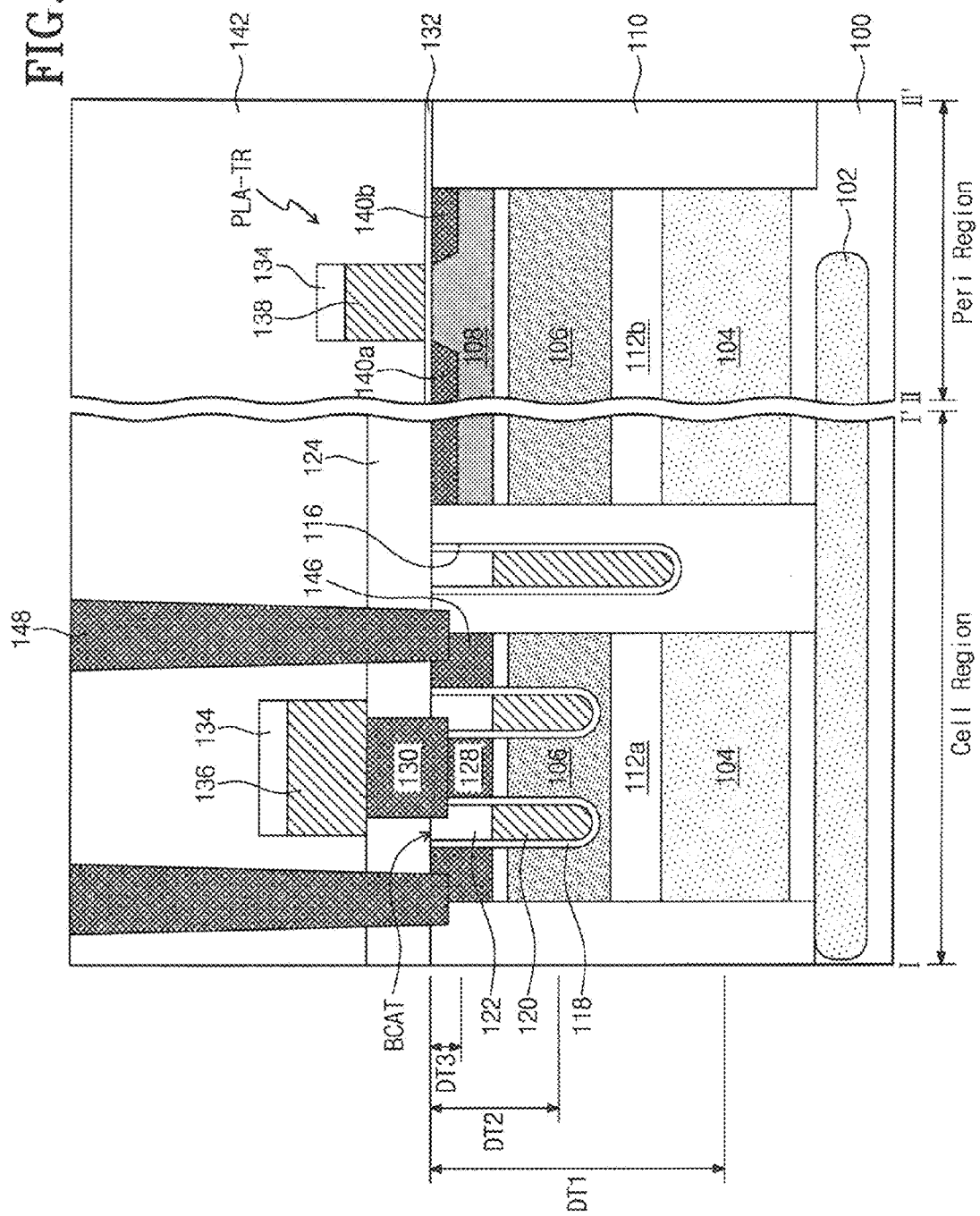

Referring to FIGS. 14A and 14B, a second contact plug 148 filling the second contact hole 144 of the second interlayer insulating layer 142 may be formed.

According to some aspects of the inventive concepts, the second contact plug 148 may include polysilicon including an impurity of the second conductivity type. In this case, the process of FIGS. 12A and 12B may be omitted. After forming the second contact plug 148, the impurity of the second conductivity type in the second contact plug 148 may diffuse into the second region of the cell active pattern 112*a*. The second region of the cell active pattern 112*a* with the impurity of the second conductivity type may form the cell drain region 146 (or cell source region) of the BCAT being completed on the cell region.

According to other aspects of the inventive concepts, the first contact plug 130 may include metal such as tungsten, copper or silver. In this case, the process of FIGS. 12A and 12B may not be omitted.

As a result of this, the BCAT including the cell gate insulating layer 118, the cell gate electrode 120 and the cell source/drain region 146 may be formed on the cell region. The cell source/drain region 146 may be doped with an impurity of the second conductivity type. The second impurity region 106 may be doped with an impurity of the first conductivity type to function as a channel region of the BCAT.

Although not illustrated in detail, a capacitor may be further formed to be electrically connected to the second contact plug 148.

By doing that, a planar transistor PLA_TR including the peripheral gate insulating layer 132, the peripheral gate electrode 138 and the peripheral source/drain regions 140*a* and 140*b* may be formed on the peripheral region. The peripheral gate electrode 138 and the peripheral source/drain regions 140*a* and 140*b* may be doped with an impurity of the second conductivity type. The third impurity region 108 may be doped with an impurity of the first conductivity type to function as a channel region of the planar transistor PLA_TR.

On the peripheral region, the second impurity region 106 for a channel region of the BCAT is formed under a channel region of the planar transistor and the second impurity region 106 under the channel region of the planar transistor may function as a well region of the planar transistor PLA_TR.

The second impurity region 106 for the channel region of the BCAT of the cell region is formed on the cell region and the peripheral region together without a mask. The third impurity region 108 for the channel region of the planar transistor of the peripheral region is formed on the cell region and the peripheral region together without a mask. Accordingly, the process may become more simple and the third impurity region 108 of the cell region and the second impurity region 106 of the peripheral region do not affect the characteristics of the semiconductor device.

Figure 15A:
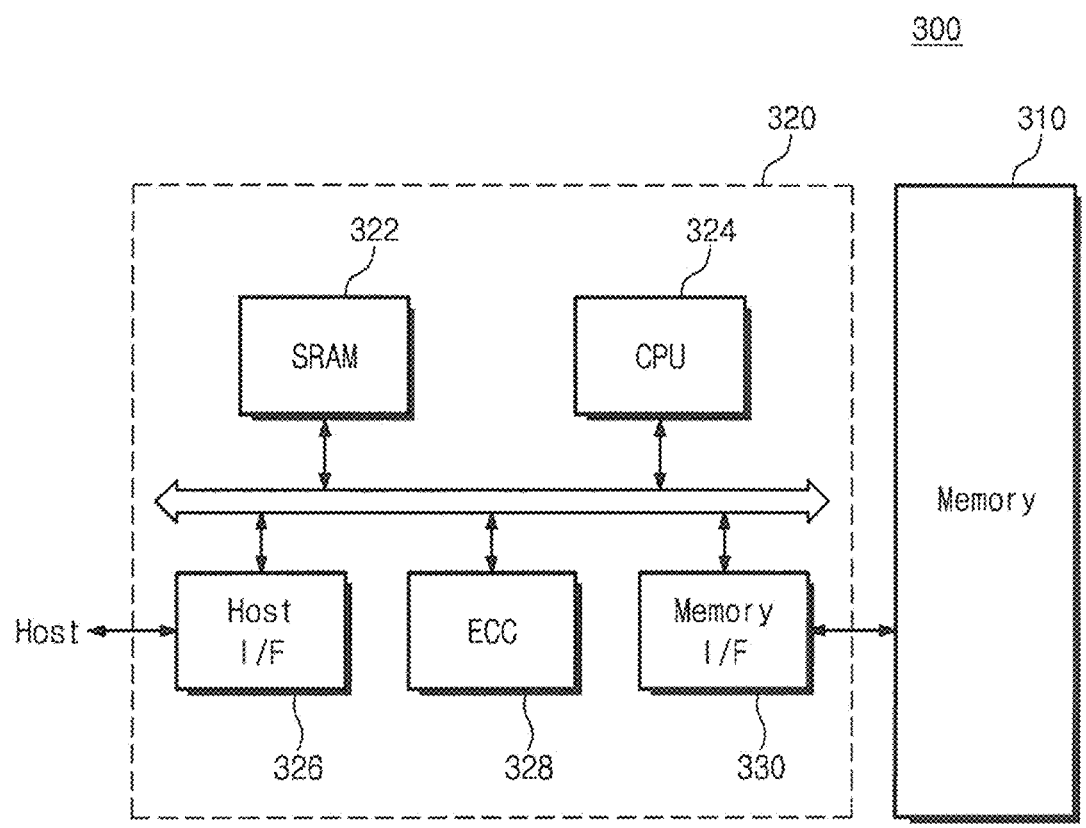
FIG. 15A is a block diagram illustrating a memory card including a semiconductor package in accordance with some embodiments of the inventive concept.

FIG. 15A is a block diagram illustrating a memory card including a semiconductor package in accordance with some embodiments of the inventive concept.

Referring to FIG. 15A, the semiconductor device in accordance with some embodiments of the inventive concept may be applied to a memory card 300. The memory card 300 may include a memory controller 320 controlling an overall data exchange between a host and a memory 310. A SRAM 322 may be used as an operation memory of a CPU (central processing unit) 324. A host interface 326 may include a data exchange protocol of the host being connected to the memory card 300. An ECC (error correction code) 328 may detect and correct an error included in data read from the memory 310. A memory interface 330 interfaces with the memory 310. The CPU 324 performs an overall control operation for a data exchange of the memory controller 320.

Figure 15B:
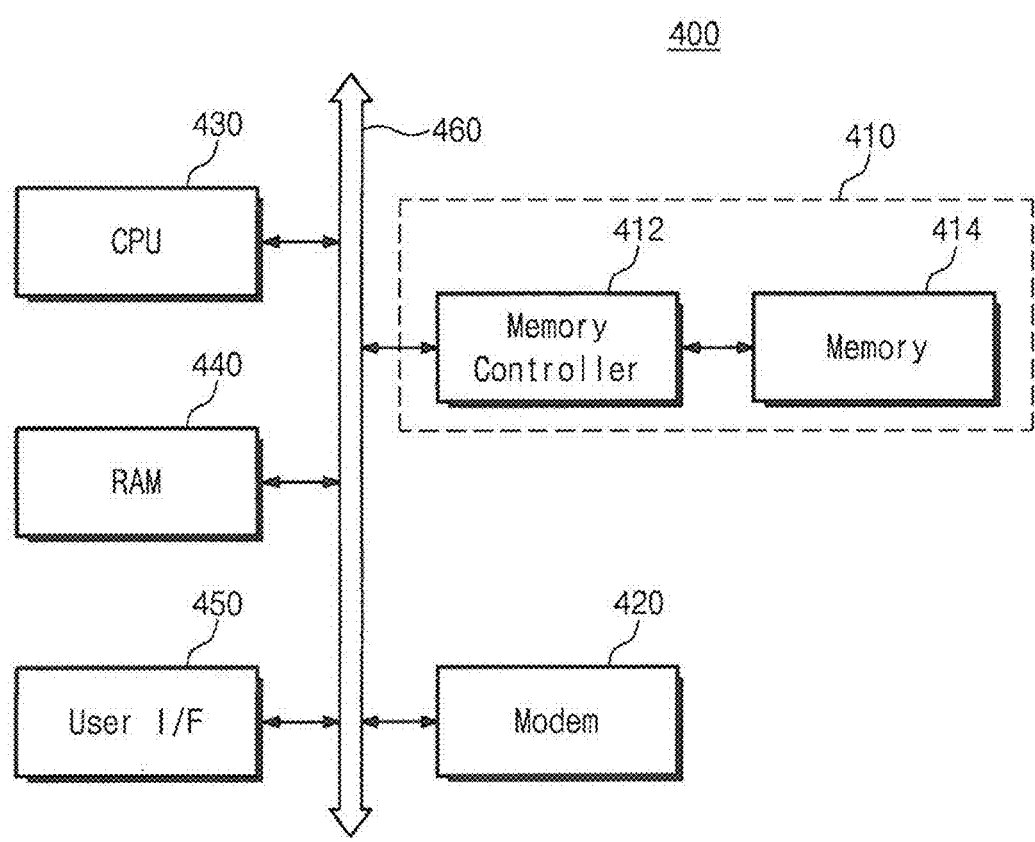
FIG. 15B is a block diagram illustrating an information processing system for applying a semiconductor package in accordance with some embodiments of the inventive concept.

FIG. 15B is a block diagram illustrating an information processing system for applying a semiconductor package in accordance with some embodiments of the inventive concept.

Referring to FIG. 15B, an information processing system 400 may include the semiconductor memory device in accordance with some embodiments of the inventive concept. The information processing system 400 may include a mobile device, a computer, etc. The information processing system 400 may include a memory system 410, and a modem 420, a CPU (central processing unit) 430, a RAM 440 and a user interface 450 that are electrically connected to a system bus 460. The memory system 410 may store data processed by the CPU 430 or data input from the outside. The memory system 410 may include a memory 412 and a memory controller 412 and may be constituted to be the same with the memory card 300 described with reference to FIG. 15A. The information processing system 400 may be provided by a memory card, a SSD (solid state drive), a camera image processor and an application chipset. The memory system 410 may be constituted by a SSD and in this case, the information processing system 400 may stably and reliably store large amounts of data in the memory system 410.

According to some embodiments of the inventive concept, an impurity region for a channel region of a cell transistor is formed in a cell region and a peripheral region without a mask and an impurity region for a channel region of a peripheral transistor is formed in a cell region and a peripheral region without a mask. Accordingly, a process may become simple.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A method of fabricating a semiconductor device comprising:
   forming a first impurity region in a substrate by implanting a first impurity of a first conductivity type in a cell region and a peripheral region of the substrate to a first depth from a top surface of the substrate;
   forming a second impurity region in the cell region and the peripheral region by implanting a second impurity of the first conductivity type into the cell region and the peripheral region to a second depth from the top surface of the substrate that is less than the first depth;

forming a cell transistor with a channel in the cell region, wherein the first impurity region forms the channel of the cell transistor, wherein the cell transistor comprises a buried channel array transistor; and forming a peripheral transistor with a channel in the peripheral region, wherein the second impurity region forms the channel of the peripheral transistor, wherein the peripheral transistor comprises a planar peripheral transistor.

2. The method of claim 1, further comprising forming a device isolation layer defining a cell active pattern in the cell region and defining a peripheral active pattern in the peripheral region.

3. The method of claim 2, wherein the forming the cell transistor comprises:
   forming a recess crossing the cell active pattern and the device isolation layer;
   forming a cell gate insulating layer in the recess;
   forming a cell gate electrode on the cell gate insulating layer in a lower portion of the recess;
   forming a cell capping pattern on the cell gate electrode in an upper portion of the recess; and
   forming a cell source/drain region by implanting a third impurity of a second conductivity type different from the first conductivity type into the cell active pattern adjacent to both sides of the cell gate electrode.

4. The method of claim 3, wherein a bottom surface of the recess has a depth substantially equal to the first depth.

5. The method of claim 3, wherein forming the cell source/drain region comprises:
   forming an interlayer insulating layer including a contact hole exposing portions of the cell active pattern adjacent to opposite sides of the cell capping pattern; and
   forming the cell source/drain region by implanting the third impurity of the second conductivity type into the portions of the cell active pattern exposed by the contact hole.

6. The method of claim 3, wherein forming the cell source/drain region comprises:
   forming an interlayer insulating layer including a contact hole exposing the cell active pattern adjacent to opposite sides of the cell capping pattern;
   forming a contact plug by filling the contact hole with polysilicon doped with the third impurity of the second conductivity type; and
   forming the cell source/drain region by diffusing the third impurity of the second conductivity type in the contact plug into the cell active pattern adjacent to the both sides of the cell capping pattern.

7. The method of claim 3, wherein forming the peripheral transistor comprises:
   forming a peripheral gate insulating layer on the peripheral region of the substrate;
   forming a peripheral gate electrode on the peripheral gate insulating layer; and
   forming a peripheral source/drain region by implanting a fourth impurity of the second conductivity type into the peripheral active pattern adjacent to opposite sides of the peripheral gate electrode.

8. The method of claim 7, further comprising forming a bit line electrically connected to the cell source/drain region of the cell region,
   wherein the bit line is formed concurrently with the peripheral gate electrode.

9. A method of fabricating a semiconductor device comprising:
   forming a first channel region in a cell region of a substrate;
   forming a second channel region in a peripheral region of the substrate;
   forming a cell transistor with the first channel region in the cell region; and
   forming a peripheral transistor with the second channel region in the peripheral region,
   wherein forming the first and second channel regions comprises successively implanting first impurity ions of a first conductivity type and second impurity ions of the first conductivity type to different depths in the substrate without a mask.

10. The method of claim 9, wherein forming the first channel region in the cell region comprises:
    implanting the first impurity ions into the substrate, wherein a peak concentration of the first impurity ions is spaced a first depth apart from a top surface of the substrate; and
    diffusing the first impurity ions to form a first impurity region.

11. The method of claim 10, wherein forming the second channel region in the peripheral region comprises:
    implanting the second impurity ions into a second target location, wherein a peak concentration of the second impurity ions is spaced a second depth from the top surface of the substrate that is less than the first depth; and
    diffusing the second impurity ions to form a second impurity region.

12. The method of claim 11, wherein forming the cell transistor in the cell region comprises:
    forming a recess in cell region of the substrate;
    forming a cell gate insulating layer in the recess;
    forming a cell gate electrode on the cell gate insulating layer in a lower portion of the recess;
    forming a cell capping pattern on the cell gate electrode in an upper portion of the recess; and
    forming a cell source/drain region by implanting third impurity ions of a second conductivity type different from the first conductivity type into a cell active pattern adjacent to both sides of the cell gate electrode.

13. The method of claim 11, wherein forming the peripheral transistor in the peripheral region comprises:
    forming a peripheral gate insulating layer on the peripheral region;
    forming a peripheral gate electrode on the peripheral gate insulating layer; and
    forming a peripheral source/drain region by implanting fourth impurity ions of a second conductivity type into a peripheral active pattern adjacent to opposite sides of the peripheral gate electrode.

14. A method of fabricating a semiconductor device comprising:
    providing a semiconductor substrate including a cell region and a peripheral region;
    implanting first impurity ions of a first conductivity type in the cell region and the peripheral region to a first depth from a top surface of the semiconductor substrate to form a first impurity region in the semiconductor substrate;
    implanting second impurity ions of the first conductivity type into the cell region and the peripheral region to a second depth from the top surface of the semiconductor substrate that is less than the first depth to form a second impurity region in the semiconductor substrate;

forming a recess in the cell region extending through the second impurity region and into the first impurity region;

forming a cell gate insulating layer in the recess;

forming a cell gate electrode in the recess, wherein the cell gate electrode is spaced apart from the first impurity region by the cell gate insulating layer;

forming a peripheral gate insulating layer on the top surface of the semiconductor substrate in the peripheral region; and forming a peripheral gate electrode on the peripheral gate insulating layer.

15. The method of claim 14, further comprising:

implanting third impurity ions of the first conductivity type into the cell region and the peripheral region to a third depth from the top surface of the semiconductor substrate that is larger than the first depth to form a third impurity region in the semiconductor substrate.

16. The method of claim 15, further comprising:

implanting fourth impurity ions of a second conductivity type that is different from the first conductivity type into the cell region and the peripheral region to a fourth depth from the top surface of the semiconductor substrate that is larger than the third depth to form a well region in the semiconductor substrate.

17. The method of claim 14, further comprising:

forming a device isolation layer defining a cell active pattern in the cell region and defining a peripheral active pattern in the peripheral region; and wherein forming the recess in the cell region comprises forming a first recess in the cell active pattern and forming a second recess in the device isolation layer.

18. The method of claim 17, wherein forming the cell gate insulating layer comprises forming a first cell gate insulating layer in the first recess and forming a second cell gate insulating layer in the second recess; and wherein forming the cell gate electrode comprises forming a first cell gate electrode in the first recess and forming a second cell gate electrode in the second recess.

19. The method of claim 17, wherein the second recess is deeper than the first recess.

20. The method of claim 17, further comprising implanting third impurity ions of a second conductivity type that is different from the first conductivity type into the cell region and the peripheral region to a third depth from the top surface of the semiconductor substrate that is larger than the first depth to form a well region in the semiconductor substrate, wherein the well region extends below the device isolation layer from the cell region to the peripheral region.

* * * * *